(12) United States Patent
Melanson

(10) Patent No.: US 7,148,830 B2
(45) Date of Patent: *Dec. 12, 2006

(54) LOOK-AHEAD DELTA SIGMA MODULATOR WITH PRUNING OF OUTPUT CANDIDATE VECTORS USING QUANTIZATION ERROR MINIMIZATION PRUNING TECHNIQUES

(75) Inventor: John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 4 days.

This patent is subject to a terminal disclaimer.

(21) Appl. No.: 11/043,719

(22) Filed: Jan. 26, 2005

(65) Prior Publication Data

US 2005/0162285 A1 Jul. 28, 2005

Related U.S. Application Data

(60) Provisional application No. 60/588,951, filed on Jul. 19, 2004, provisional application No. 60/539,132, filed on Jan. 26, 2004.

(51) Int. Cl.
*H03M 3/00* (2006.01)
(52) U.S. Cl. .................. 341/143; 341/144; 341/155
(58) Field of Classification Search ............... 341/143
See application file for complete search history.

(56) References Cited

U.S. PATENT DOCUMENTS

| | | | | |
|---|---|---|---|---|
| 5,548,286 A | * | 8/1996 | Craven ................. | 341/126 |
| 5,550,544 A | | 8/1996 | Sakiyama et al. ...... | 341/155 |
| 5,585,801 A | | 12/1996 | Thurston ............... | 341/143 |
| 5,598,159 A | * | 1/1997 | Hein .................... | 341/143 |
| 5,708,433 A | * | 1/1998 | Craven ................. | 341/144 |
| 5,742,246 A | | 4/1998 | Kuo et al. .............. | 341/143 |
| 5,757,300 A | | 5/1998 | Koilpillai et al. ...... | 341/143 |
| 5,757,517 A | | 5/1998 | Couwenhoven et al. .. | 358/463 |
| 5,786,779 A | | 7/1998 | Chun et al. ............ | 341/61 |

(Continued)

FOREIGN PATENT DOCUMENTS

EP 0512687 11/1992

(Continued)

OTHER PUBLICATIONS

Angus, James A.S., "Tree Based Lookahead Sigma Delta Modulators," Audio Engineering Society 114th Convention, Convention Paper 5825, Mar. 22-25, 2003, pp. 1-8.

(Continued)

*Primary Examiner*—Rexford Barnie
*Assistant Examiner*—Khai M. Nguyen
(74) *Attorney, Agent, or Firm*—Hamilton & Terrile, LLP; Kent B. Chambers

(57) ABSTRACT

A look-ahead delta sigma modulator utilizes pruning techniques to reduce the number of possible output candidate vectors used to determine quantization output values. The look-ahead delta-sigma modulators can also combine the pruning techniques with a reduction in the amount of processing by simplifying the computations used to generate quantizer output values. In one embodiment, the pruning techniques exploit application of superposition techniques to a loop filter response of the look-ahead delta sigma modulator. The set of possible pattern response vectors can be pruned to form a subset of P candidate pattern response vectors. If an element value of a pattern response vector proximally matches a value of the corresponding reference element of the natural response vector, a quantizer uses the proximally matching pattern response vector to determine a quantization output value.

38 Claims, 15 Drawing Sheets

U.S. PATENT DOCUMENTS

| | | | | |
|---|---|---|---|---|
| 5,977,899 | A | 11/1999 | Adams et al. | 341/145 |
| 6,067,515 | A | 5/2000 | Cong et al. | 704/243 |
| 6,070,136 | A | 5/2000 | Cong et al. | 704/222 |
| 6,112,218 | A | 8/2000 | Gandhi et al. | 708/320 |
| 6,160,505 | A | 12/2000 | Vaishampayan | 341/143 |
| 6,177,897 | B1 | 1/2001 | Williams, III | 341/150 |
| 6,232,899 | B1 | 5/2001 | Craven | 341/126 |
| 6,310,518 | B1 | 10/2001 | Swanson | 330/282 |
| 6,313,773 | B1 | 11/2001 | Wilson et al. | 341/143 |
| 6,347,297 | B1 | 2/2002 | Asghar et al. | 704/243 |
| 6,362,769 | B1 | 3/2002 | Hovin et al. | 341/157 |
| 6,373,416 | B1 | 4/2002 | McGrath | 341/143 |
| 6,392,576 | B1 | 5/2002 | Wilson et al. | 341/143 |
| 6,418,172 | B1 | 7/2002 | Raghavan et al. | 375/262 |
| 6,480,129 | B1 | 11/2002 | Melanson | 341/143 |
| 6,480,528 | B1 | 11/2002 | Patel et al. | 375/148 |
| 6,501,404 | B1 | 12/2002 | Walker | 341/143 |
| 6,590,512 | B1 | 7/2003 | Roh et al. | 341/143 |
| 6,639,531 | B1 | 10/2003 | Melanson | 341/143 |
| 6,724,332 | B1 | 4/2004 | Melanson | 341/143 |
| 6,760,573 | B1 | 7/2004 | Subrahmanya et al. | 455/192.2 |
| 6,822,594 | B1 * | 11/2004 | Melanson et al. | 341/143 |
| 6,842,128 | B1 | 1/2005 | Koh | 341/143 |
| 6,842,486 | B1 | 1/2005 | Plisch et al. | 375/247 |
| 6,861,968 | B1 | 3/2005 | Melanson | 341/143 |
| 6,873,278 | B1 | 3/2005 | Ferguson, Jr. et al. | 341/144 |
| 6,873,280 | B1 | 3/2005 | Robinson et al. | 341/159 |
| 6,879,275 | B1 | 4/2005 | Melanson | 341/143 |
| 6,888,484 | B1 | 5/2005 | Kiss et al. | 341/143 |
| 6,933,871 | B1 | 8/2005 | Melanson | 341/143 |
| 6,940,434 | B1 | 9/2005 | Brooks | 341/131 |
| 6,956,514 | B1 | 10/2005 | Melanson et al. | 341/143 |
| 6,967,606 | B1 | 11/2005 | Wiesbauer et al. | 341/143 |
| 2003/0086366 | A1 | 5/2003 | Branlund et al. | 370/208 |
| 2003/0231729 | A1 | 12/2003 | Chien et al. | 375/376 |
| 2005/0012649 | A1 | 1/2005 | Adams et al. | 341/143 |
| 2005/0052300 | A1 | 3/2005 | Ranganathan | 341/143 |

FOREIGN PATENT DOCUMENTS

| | | |
|---|---|---|
| EP | 1227595 | 7/2002 |
| JP | 2003-124812 | 4/2003 |
| JP | PUB. 2003-124812 | 4/2003 |

OTHER PUBLICATIONS

Harpe, Pieter, et al., "Efficient Trellis-Type Sigma Delta Modulator," Audio Engineering Society 114th Convention, Convention Paper 5845, Mar. 22-25, 2003, pp. 1-8.

Hawksford, M.O.J., "Parametrically Controlled Noise Shaping in Variable State-Step-Back Pseudo-Trellis SDM," Audio Engineering Society 115th Convention, Convention Paper, Oct. 10-13, 2003, pp. 1-14.

Kato, Hiroshi, "Trellis Noise-Shaping Converters and 1-bit Digital Audio." Audio Engineering Society 112th Convention, Convention Paper 5615, May 10-13, 2002, pp. 1-9.

Sony Electronics, Inc. and Philips Electronics N.V., "Super Audio Compact Disc, A Technical Proposal," 1997, pp. 2-11 unknown month.

Paulos, John J. et al., "Improved Signal-To-Noise Ratio Using Tri-Level Delta-Sigma Modulation." Reprinted from IEEE Proc. ISCAS, May 1987, pp. 245-248.

Knapen, Eric et al., "Lossless Compression of 1-Bit Audio," J. Audio Eng. Soc., vol. 52, No. 3, Mar. 2004, pp. 190-199.

Zetterberg, L.H. et al., "Adaptive Delta Modulation with Delayed Decision," IEEE Transactions on Communications, IEEE vol. COM-22, No. 9, Sep. 1974, pp. 1195-1198.

Stonick, J.T. et al., "Look-Ahead Decision-Feedback $\Sigma \Delta$ Modulation," IEEE International Conference on Acoustics, Speech and Signal Processing, New York, 1994, pp. III. 541-III. 544 unknown month.

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of 3rd Order Sigma-Delta Modulators via FPGA Implementation," ASIC/SOC Conference, 2001, Proceedings, 14th Annual IEEE International Sep. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, 1995, pp. 1-6 unknown month.

Lindfors, S., "A Two-Step Quantization $\Delta \Sigma$-Modulator Architecture with Cascaded Digital Noise Cancellation," Electronics, Circuits and Systems, 2000, ICECS, The 7th IEEE International Conference, Dec. 17-20, 2000, vol. 1, pp. 125-128.

Harris, F.J. et al., "Implementation Considerations and Limitations for Dynamic Range Enhanced Analog to Digital Converters," IEEE International Conference on Acoustics, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 IEEE International Symposium, May 31-Jun. 3, 1998, vol. 1, pp. 583-586.

* cited by examiner

Legend
Ⓧ = SNAT Reference Element Value

Legend
(X) = SNAT Reference Element Value

LOOK-AHEAD DELTA SIGMA MODULATOR WITH PRUNING OF OUTPUT CANDIDATE VECTORS USING QUANTIZATION ERROR MINIMIZATION PRUNING TECHNIQUES

CROSS-REFERENCE TO RELATED APPLICATION

This application claims the benefit under 35 U.S.C. § 119(e) of (i) U.S. Provisional Application No. 60/539,132, filed Jan. 26, 2004 and entitled "Signal Processing Systems with Look-Ahead Delta-Sigma Modulators" and (ii) U.S. Provisional Application No. 60/588,951, filed Jul. 19, 2004 and entitled "Signal Processing Systems with Look-Ahead Delta-Sigma Modulators". Provisional applications (i) and (ii) include example systems and methods and are incorporated by reference in their entireties.

BACKGROUND OF THE INVENTION

1. Field of the Invention

The present invention relates in general to the field of signal processing, and more specifically to a system and method for pruning output candidate vectors of a look-ahead delta sigma modulator using quantization error based pruning techniques. In one embodiment, pruning techniques use natural and pruned pattern loop filter responses to quantize input signal data.

2. Description of the Related Art

A few signal processing systems implement look-ahead delta-sigma modulators in an attempt to obtain superior input/output signal fidelity by minimizing long term error. "Delta-sigma modulators" are also commonly referred to using other interchangeable terms such as "sigma-delta modulators", "delta-sigma converters", "sigma delta converters", and "noise shapers".

Conventional research in look-ahead modulators primarily involves two threads. The first are the works of Hiroshi Kato, "Trellis Noise-Shaping Converters and 1-bit Digital Audio," AES 112th Convention, 2002 May 10–13 Munich, and Hiroshi Kato, Japanese Patent JP, 2003-124812 A, and further refinements described in Harpe, P., Reefman D., Janssen E., "Efficient Trellis-type Sigma Delta Modulator," AES 114th Convention, 2003 Mar. 22–25 Amsterdam (referred to herein as "Harpe"); James A. S. Angus, "Tree Based Look-ahead Sigma Delta Modulators," AES 114th Convention, 2003 Mar. 22–25 Amsterdam; James A. S. Angus, "Efficient Algorithms for Look-Ahead Sigma-Delta Modulators," AES 155th Convention, 2003 Oct. 10–13 New York (referred to herein as "Angus"); Janssen E., Reefman D., "Advances in Trellis based SDM structures," AES 115th Convention, 2003 Oct. 10–13 New York. This research targets solving the problems of 1-bit encoding of audio data for storage without using the steep anti-alias filters associated with pulse code modulation "PCM." The advent of super audio compact disc "SACD" audio storage, with its moderate oversampling ratios (32 or 64), motivated this work.

FIG. 1 depicts a prior art signal processing system 100 having a look-ahead delta-sigma modulator 102. The signal source 102 provides an input signal to pre-processing components 104. Preprocessing components 104 include an analog-to-digital converter ("ADC") and oversampling components to generate a k-bit, digital input signal x(n). For audio applications, x(n) generally represents a signal sampled at 44.1 kHz times an oversampling ratio, such as 64:1. Look-ahead modulator 106 quantizes input signal x(n) and shapes the quantization noise so that most of the quantization noise is moved out of the signal band of interest, e.g. approximately 0–20 kHz for audio applications. Each output signal y(n) (also referred to herein as an "output value") generally has one of two values selected from the set $\{+\Delta/2, -\Delta/2\}$ with "$\Delta$" representing the full swing of y(n). (For convenience, $\Delta/2$ will be represented as +1, and $-\Delta/2$ will be represented as −1.). The output signal y(n) can be further processed and, for example, used to drive an audio sound system or can be recorded directly onto a storage medium.

FIG. 2 depicts a schematic representation of a conventional look-ahead delta-sigma modulator 106 with a look-ahead depth of M. Table 1 describes an embodiment of the symbols used in FIG. 2.

TABLE 1

| Symbol | Definition |
|---|---|
| x(n) | The nth discrete input signal. |
| $X_t$ | Input signal vector of length M at a time t. $X_t = [x(n), x(n+1), \ldots, x(n+M-1)]$. |
| y(n) | The nth discrete output signal. |
| $Y_{Di}$ | The ith output delayed by one candidate vector. |
| $C_i$ | The ith cost value vector = $H(D_i(z))$. |
| M | Look-ahead depth. |
| N | $N = r^M$ = The number of output signal candidate sets under consideration, and r = number of possible values for y(n). |
| i | i is selected from the set $\{0, 1, 2, \ldots N-1\}$. |
| $C^{(2)}_i$ | The ith cost value power. |
| $C^{(2)}_{min}$ | The minimum cost value power at time t. |

The look-ahead depth M refers to the dimension of each delayed output candidate vector $Y_{Di}$ used to determine output signal y(n). For time t, a negative delayed output candidate vector $-Y_{Di}$, $i \in \{0,1,2, \ldots, N-1\}$, and the input vector $X_t$ are inputs to noise shaping filter 202(i). For a look-ahead depth of M and $y(n) \in \{-1, +1\}$, and without pruning output candidates, each of the N delayed output candidate vectors contains a unique set of elements. Each noise-shaping filter 202(i) of look-ahead delta-sigma modulator 106 uses a common set of filter state variables for time t during the calculations of respective cost value vectors $C_i$. Filter 202 maintains the actual filter state variables used during the calculation of each y(n). The state variables are updated with the selected y(n) output value. Loop filter 202 processes $X_t$ and $-Y_i$ to produce an error value, which in this embodiment is referred to as cost value vector $C_i$. Cost value vector $C_i$, and, thus, each element of cost value vector $C_i$ is a frequency weighted error value. In some embodiments of look-ahead delta-sigma modulator 106, input signal vector $X_t$ and delayed output candidate vectors $Y_{Di}$ are also used as direct inputs to filter 202(i).

Quantizer error and output generator 203 includes two modules to determine y(n). The cost function minimum search module 204 computes the cost value power, $C_i^{(2)}$, of each cost value vector $C_i$ in accordance with Equation 1, and determines the minimum cost value power at time t.

$$C_i^{(2)} = \sum_{t=1}^{t=M} [c_t]^2.$$ Equation 1

"$c_t$" represents a cost value for time t, t=1 through M, in the cost vector $C_i$. Thus, the cost function minimum search module 204 of quantizer 203 attempts to minimize the energy out of loop filter 202. Minimizing the energy out of loop filter 202 effectively drives the input $C_i$ to a small value, which effectively results in a relatively high loop gain for look-ahead delta-sigma modulator 106 and, thus, modifies the noise shaping transfer function in an undesirable way.

The y(n) selector module 206 selects y(n) as the leading bit of $Y_i$ where $C_{i\,min}^2$ represents the minimum cost value power.

For example, if M=2 and y∈{−1,+1}, then N=4, i□{0,1,2,3}, and Table 2 represents each of the Y output candidate vectors and $X_t$.

TABLE 2

|  | $Y_1$ | $Y_2$ | $Y_3$ | $Y_4$ | $X_t$ |
|---|---|---|---|---|---|
| $y_t$ | 0 | 0 | 1 | 1 | x(n) |
| $y_{t+1}$ | 0 | 1 | 0 | 1 | x(n + 1) |

If $C_3^{(2)}$ represents the minimum cost value power, then selector module 206 selects y(n)=1 because the first bit in output candidate vector $Y_3$ (the output candidate vector associated with $C_3^{(2)}$), equals 1. If $C_1^{(2)}$ represents the minimum cost value power, then selector module 206 selects y(n)=0 because the first bit in output candidate vector $Y_1$ (the output candidate vector associated with $C_1^{(2)}$), equals 0.

The second primary thread of look-ahead modulator research involves pulse width modulation ("PWM") amplifiers based on delta-sigma modulators combined with digital PWM modulation stages. The principal researchers have been Peter Craven and John L. Melanson. In U.S. Pat. No. 5,784,017 entitled "Analogue and Digital Converters Using Pulse Edge Modulations with Non-Linear Correction," inventor Peter Craven ("Craven"), which is incorporated herein by reference in its entirety, Craven described the use of look-ahead delta-sigma modulators. The purpose of Craven was to ensure stability in alternating edge modulation, an inherently difficult modulation mode to stabilize. In the PWM case, the delta-sigma modulator is operating at a low oversampling ratio (typically 4–16), and quantization noise is a special problem.

FIG. 3 depicts quantizer 106 and noise shaping loop filter 202. The filter 202 can be considered as having a noise transfer function ("NTF") and a separate signal transfer function ("STF"), as described in commonly assigned U.S. patent application Ser. No. 10/900,877, filed Jul. 28, 2004, entitled "Signal Processing with Lookahead Modulator Noise Quantization Minimization", inventor John L. Melanson (referred to herein as the "Melanson I Patent") and in chapter 4 of Norsworthy et al, "Delta Sigma Data Converters—Theory, Design, and Simulation". 1997, ISBN 0-7803-1045-4. The noise transfer function ("NTF") equals $1/[1+z^{-1}*H_2(z)]$. Filter 202 is modeled to indicate the signal transfer function $H_1(z)$, the feedback signal transfer function $H_2(z)$, and quantization noise 302. The signal transfer function ("STF") equals $H_1(z)/[1+z^{-1}*H_2(z)]$. In some implementations, H1 and H2 are identical. In the general case, H1 and H2 differ.

FIG. 4A depicts a delta sigma modulator 400A with a fourth order noise shaping loop filter 203, quantizer 404, and feedback loop with a unit delay 406, which represents one embodiment of noise shaping filter 202. Constants k0, k1, k2, and k3 are chosen to set poles in the NTF of filter 300. G1 provides a zero (0) in the NTF, which is usually set near a high frequency end of the signal pass band. Filter 300 also includes a double zero at 0 Hz. The STF has a pure pole response cascaded with a pure delay.

FIG. 4B depicts a 3rd order infinite impulse response filter 400B with delays $z^{-1}$, feedback coefficients $C_0$, $C_1$, and $C_2$, and state variables sv0, sv1, and sv2. In infinite impulse response ("IIR") filters, one or more state variables are fed back during each time step to modify one or more of the next state variables. This feedback makes it difficult to calculate future values of the filter output for look-ahead applications. The look ahead operation is of special interest in the case of delta-sigma modulation, where the feedback is quantized to a relatively small number of levels, and there are significant advantages to observing more than one potential feedback value at any given time.

One technique to implement an IIR filter adapted for look-ahead operations is depicted in IIR filter process 400C in FIG. 4C, which saves all of the state variables, advances the system clock to find future values, and then restores the state of the state variables. Operation 420 copies state variables to temporary memory, advances states with desired feedback N times (N=$2^m$ and m=lookahead depth) in operations 422, calculates state variables using desired output candidate vector elements in operation 424, stores the state variables in operation 426, and advances state one time in operation 428. The $3^{rd}$ order IIR filter 400B has a look-ahead depth of 4, the current output, and 2 future outputs. Another approach is to have multiple copies of the state variables, each representing the state variable for various states of advance or for various feedback possibilities. These multiple state variables complicate the calculation and increase the size of the state variable memory, in some cases exponentially with the look-ahead depth. In all of these cases, the future values of the input are needed to calculate the future outputs. State variable memory operations 400D for filter 400B and the z^−3 delay at the input is depicted in FIG. 4D.

In a Trellis modulator, output candidate vectors $Y_i$ (also referred to as "patterns"), extending for a depth of M sample periods, are tried as candidates for the quantizer output. The power out of the filter, signal Ci, is summed for each output candidate vector $Y_i$, and the lowest power associated output candidate vector is chosen. The first bit of the chosen output candidate vector $Y_i$ is chosen as the next output value y(n), and the iteration is repeated for the next input vector $X_{t+1}$.

Conventional look-ahead delta sigma modulators require a significant amount of computation and state storage. For a look-ahead depth of 8 bits, in the simplest case 256 copies of the delta sigma modulator are required. Most research has been directed to simplifying the computation by pruning the search so that only a moderate fraction of the $2^M$ cases are calculated. Conventional technology has not proposed a reasonable way to find the closest matching output signal sets for each time t directly given that without pruning there are $2^M$ possible reasonable combinations to search and the length of output signals Y[n] for a 1 minute signal is 60*44100*64 (i.e., 60 seconds, 44.1 kHz sampling frequency, and 64:1 oversampling ratio). Trellis searches and tree searches pruning have all been proposed as solutions to reducing the computation. Angus suggests a pruning technique by organizing look-ahead output candidates into a tree and considering only the branch containing a leaf node with a minimum accumulated error. Some pruning approaches keep the best N searches active at any given time and assume that all future good searches are the children, i.e. descendant branches and nodes, of current good searches. In some cases, this is not the case, and the best candidates for the current will have already been eliminated from contention.

SUMMARY OF THE INVENTION

In one embodiment of the present invention, a method of processing input signal data using a look-ahead delta sigma modulator of depth N using natural and pruned pattern loop filter responses, wherein N is greater than or equal to two, includes determining a set of pattern responses of a loop filter of the look-ahead delta sigma modulator for each output candidate vector by setting signal input data to the loop filter of the delta sigma modulator to at least approximately zero and filtering a set of output candidate vectors. The method further includes determining a natural response of the loop filter of the look-ahead delta sigma modulator by setting feedback data to the loop filter to at least approximately zero and filtering a set of input data signal samples. The method also includes pruning the set of pattern responses to determine a set of one or more pruned pattern responses and quantizing each input signal data sample by applying predetermined decision criteria to determine a best match between a member of the set of one or more pruned pattern responses and the natural response and selecting quantization output data from the output candidate vector associated with the pruned pattern response used to determine the best match.

In another embodiment of the present invention, a signal processing system includes a look-ahead delta sigma modulator. The look-ahead delta sigma modulator includes a loop filter and a pattern response generator coupled to the loop filter to determine a set of pattern responses by the loop filter obtained by setting signal input data to the loop filter to at least approximately zero and filtering a set of output candidate vectors. The look-ahead delta sigma modulator also includes a natural response generator to determine a natural response of the loop filter by setting feedback data to the loop filter to at least approximately zero and filtering a set of input data signal samples and a pruning generator to determine a set of one or more pruned pattern responses. The look-ahead delta sigma modulator also includes a quantizer to receive output data from the loop filter and the set of pruned pattern responses, wherein the quantizer includes a function generator to quantize each input signal data sample by applying predetermined decision criteria to determine a best match between a member of the set of one or more pruned pattern responses and selecting output data from the output candidate vector associated with the pruned pattern response used to determine the best match.

In another embodiment of the present invention, an apparatus for processing input signal data using a look-ahead delta sigma modulator of depth N using natural and pattern loop filter responses, wherein N is greater than or equal to two (2) includes means for determining a set of pattern responses of a loop filter of the look-ahead delta sigma modulator for each output candidate vector by setting signal input data to the loop filter of the delta sigma modulator to at least approximately zero and filtering a set of output candidate vectors. The apparatus also includes means for determining a natural response of the loop filter of the look-ahead delta sigma modulator by setting feedback data to the loop filter to at least approximately zero and filtering a set of input data signal samples. The apparatus further includes means for pruning the set of pattern responses to determine a set of one or more pruned pattern responses and means for quantizing each input signal data sample by applying predetermined decision criteria to determine a best match between a member of the set of one or more pruned pattern responses and the natural response and selecting quantization output data from the output candidate vector associated with the pruned pattern response used to determine the best match.

In another embodiment of the present invention, a method of processing an input signal using a look-ahead delta sigma modulator of depth N, wherein N is greater than or equal to two, the method including pruning a set of candidate vectors by selecting a subset of the candidate vectors, wherein the subset of candidate vectors minimize quantization error of the look-ahead delta sigma modulator at a future time t+n, t is the current time, and $n \geq 2$. The method further includes quantizing the input signal using the subset of candidate vectors.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
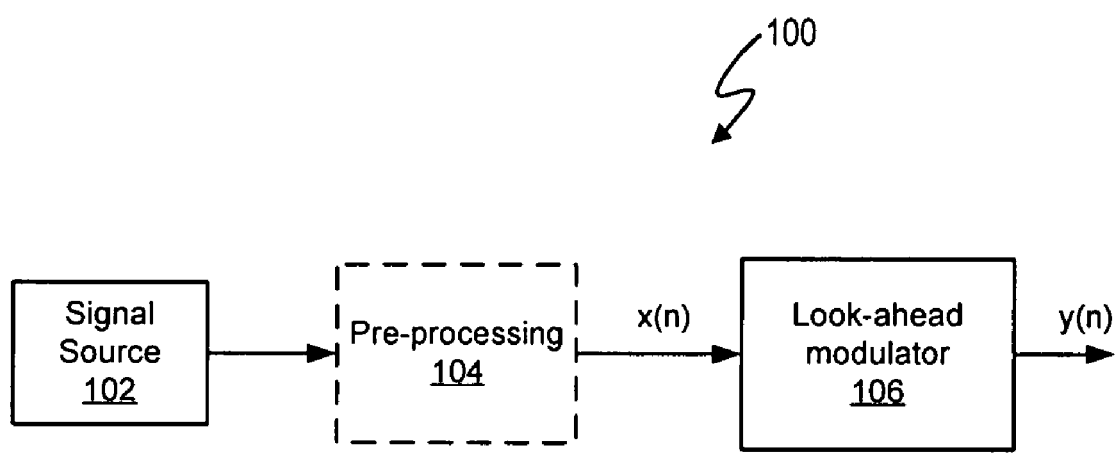
FIG. 1 (labeled prior art) depicts a signal processing system having a look-ahead delta-sigma modulator.

The nomenclature used in the below description is the same as used in the Background section above unless indicated otherwise.

The look-ahead delta sigma modulators of the signal processing systems described herein utilize pruning techniques to reduce the number of possible output candidate vectors used to determine quantization output values. The set of pruned output candidate vectors minimize quantization error of the look-ahead delta sigma modulator at a future time t+n, t is the current time, and n≧2. The pruning techniques cause very little, if any, reduction in accuracy and can significantly reduce the number of processing operations used to determine a quantization value. The look-ahead delta-sigma modulators of the signal processing systems described herein can also combine the pruning techniques with a reduction in the amount of processing by simplifying the computations used to generate quantizer output values.

In one embodiment, the pruning techniques exploit application of superposition techniques to a loop filter response of the look-ahead delta sigma modulator. By superposition, the complete loop filter response for each output candidate vector equals the difference between a pattern response and a natural input signal response. The pattern response of the loop filter can be determined from the response to each output candidate vector with an input signal set to at least approximately zero (0). "At least approximately zero" includes zero (0) and numbers small enough to adequately determine the response of the filter within a desired accuracy. The pattern response of the loop filter can also be referred to as a forced response of the loop filter to each output candidate vector. The natural input signal response of the loop filter can be determined from the response to each input signal vector with feedback data set to at least approximately zero. The pattern response is independent of the input signal data and, therefore, can be determined once for each input signal vector $X_t$, where t is a time index and t is an element of the set $\{0, 1, \ldots, T-1\}$ for all operational time T. The natural input signal response is independent of the feedback data and, therefore, need only be determined once for each output data value. The number of computations can be further reduced by eliminating duplicate computations when determining the cost values for each pattern, and eliminating pattern responses that lead to results that can not meet predetermined 'best match' criteria between the natural and pattern responses.

Look-ahead delta-sigma modulators reduce long-term quantization error. For each time t, look-ahead delta sigma modulator 500 utilizes pruning techniques to reduce the number of possible output candidate vectors used to determine quantization output values. The set of pruned output candidate vectors minimize quantization error of the look-ahead delta sigma modulator at a future time t+n, t is the current time, and n≧2. In one embodiment, the lookahead delta sigma modulator 500 generates quantization output values by determining the pattern response vector $SPAT_k$ that most closely matches the natural response vector $SNAT_t$.

The set of possible pattern response vectors can be pruned to form a subset of K candidate pattern response vectors $SPAT_k$, where $k \in \{0, 1, \ldots, K\}$ and $K \geq 1$. Each element of the natural response vector for each time t has a corresponding element in each pattern response vector. Each pattern response vector generally contains a unique set of element values. Some pattern response vectors include element values that more closely correspond to corresponding element values of the natural response vector than other pattern response vectors. One or more elements of the natural response vector can be chosen as reference elements. If an element value of a pattern response vector proximally matches a value of the corresponding reference element of the natural response vector, the pattern response vector is utilized by a quantizer to determine a quantization output value. A proximal match can be determined, for example, if the linear distance between the natural response value reference and the corresponding value of the pattern response vector is within a prescribed maximum proximal distance. If more than one natural response reference value is used to further prune the pattern response vectors, the distances between each natural response vector reference value and the corresponding pattern response vector can be combined and compared to a prescribed aggregate maximal proximal distance. Alternatively, the distances can be separately considered. In another embodiment, more than one natural response reference value can be used to expand the number of output candidate vectors used to determine a quantization output value by retaining any pattern response vector that includes at least one proximal matching value(s) within a prescribed distance.

Figure 2:
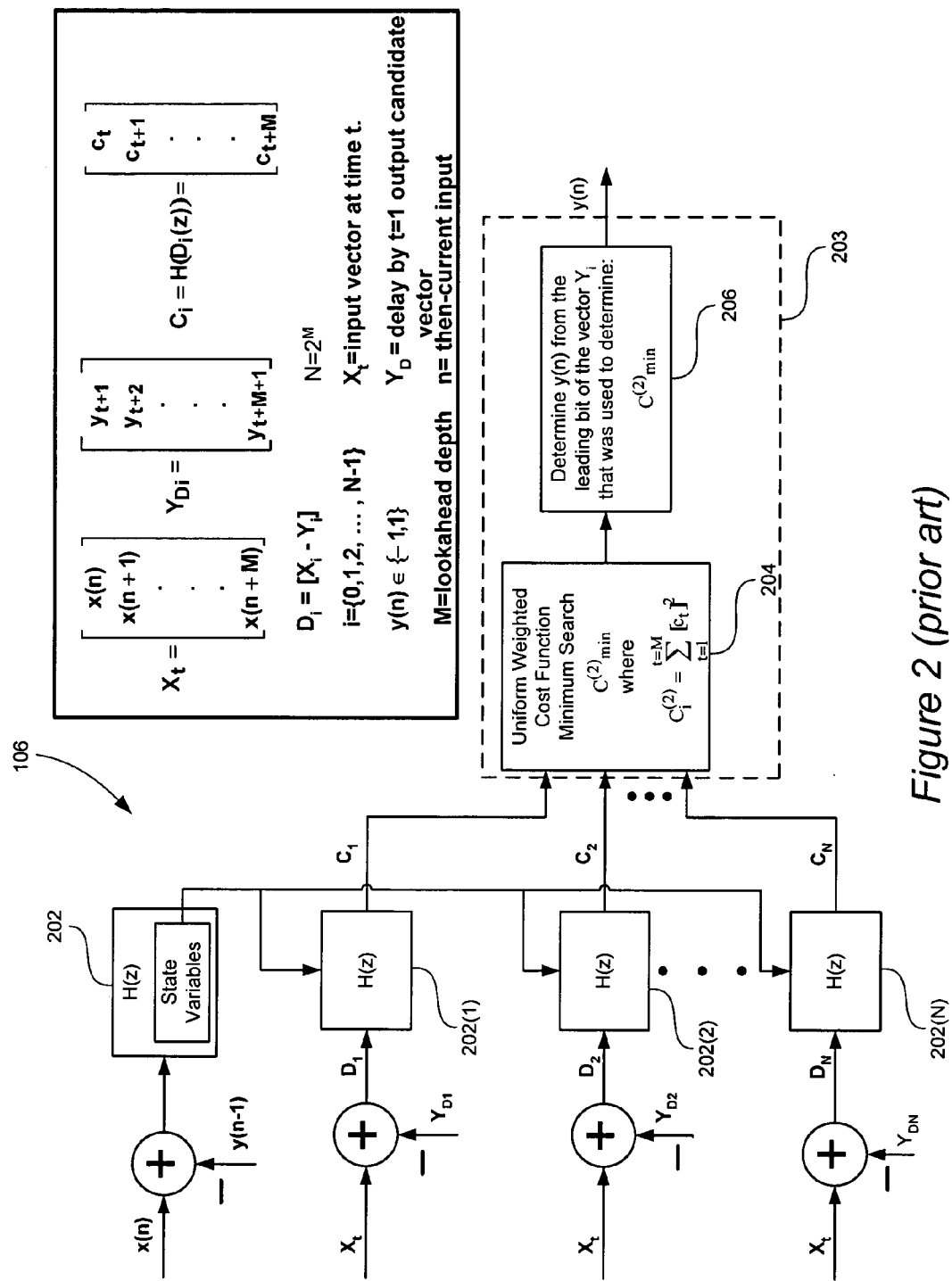
FIG. 2 (labeled prior art) depicts a schematic representation of a conventional look-ahead delta-sigma modulator.
Figure 3:
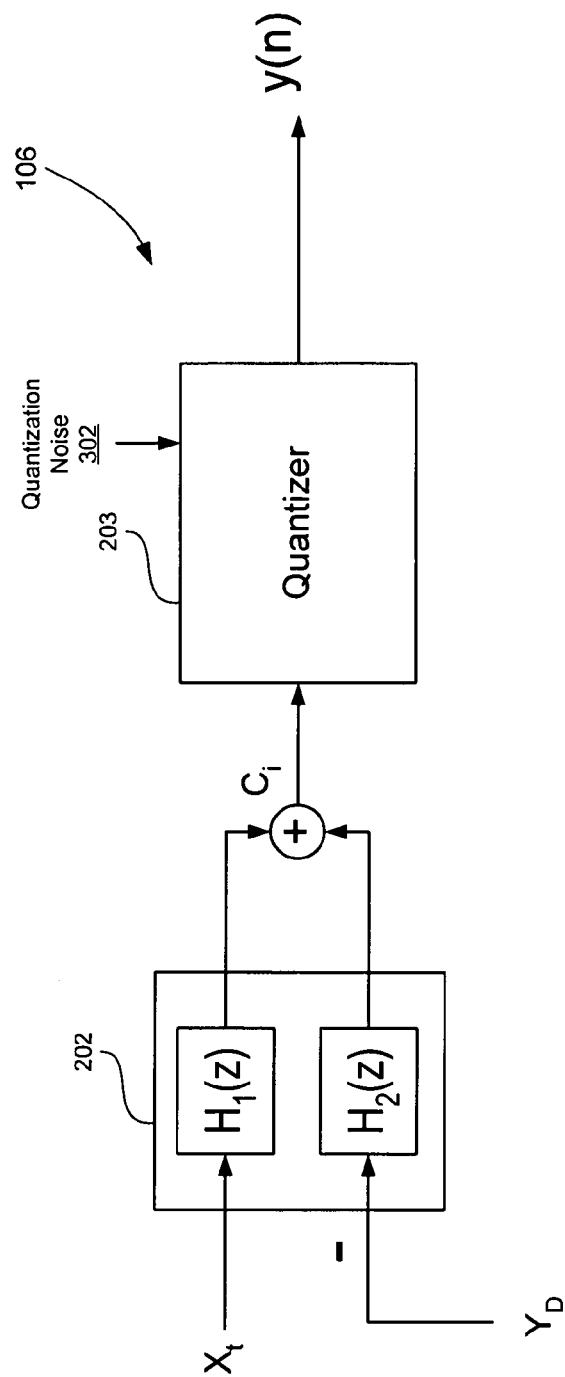
FIG. 3 (labeled prior art) depicts a quantizer and noise shaping filter.
Figure 4A:
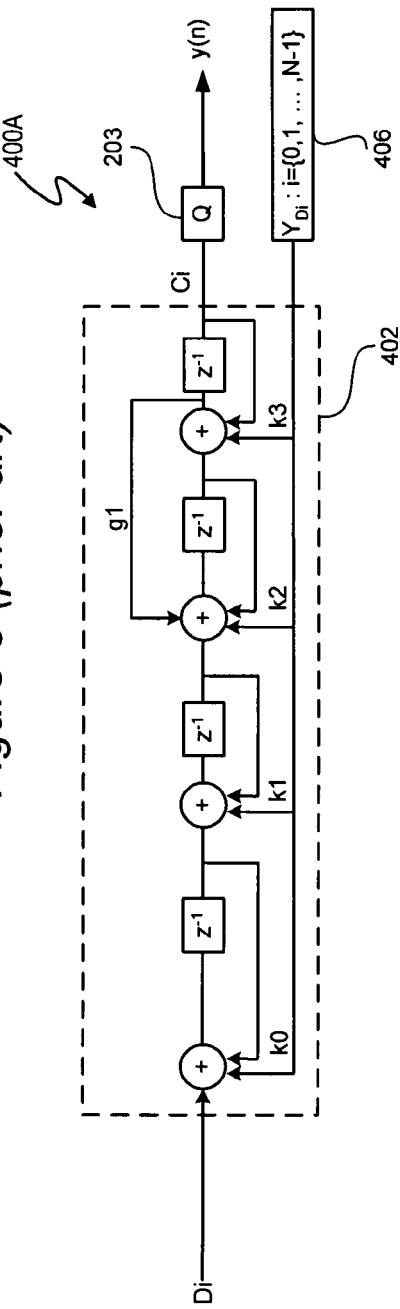
FIG. 4A (labeled prior art) depicts a delta sigma modulator with a fourth order noise shaping loop filter.
Figure 4B:
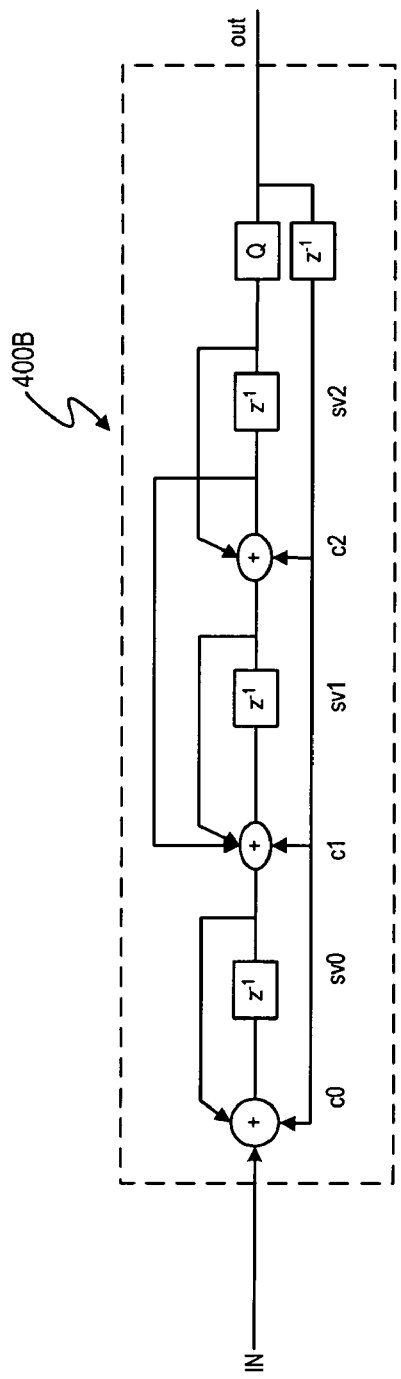
FIG. 4B (labeled prior art) depicts a third order infinite impulse response (IIR) filter.
Figure 4D:
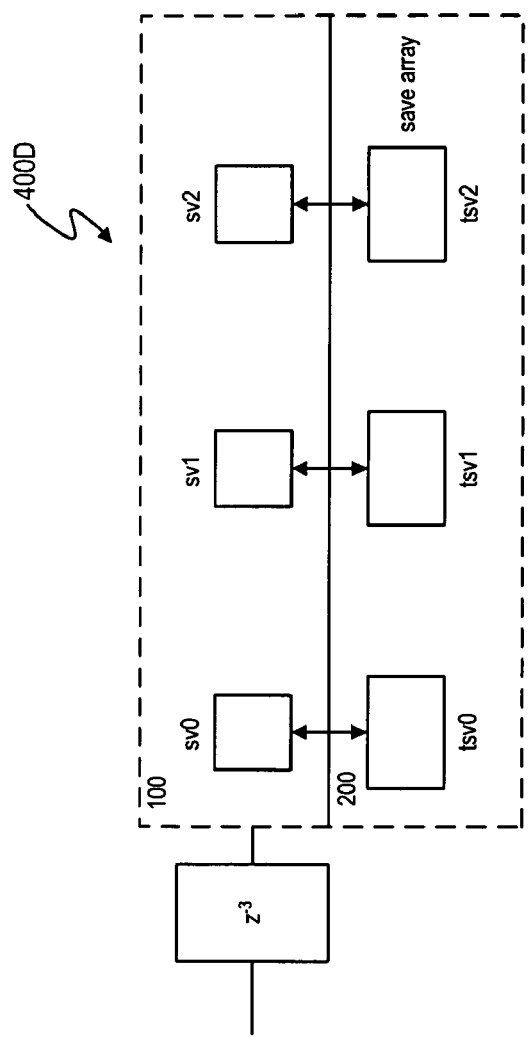
FIG. 4D (labeled prior art) depicts state variable memory operations for the IIR filter of FIG. 4B.
Figure 4C:
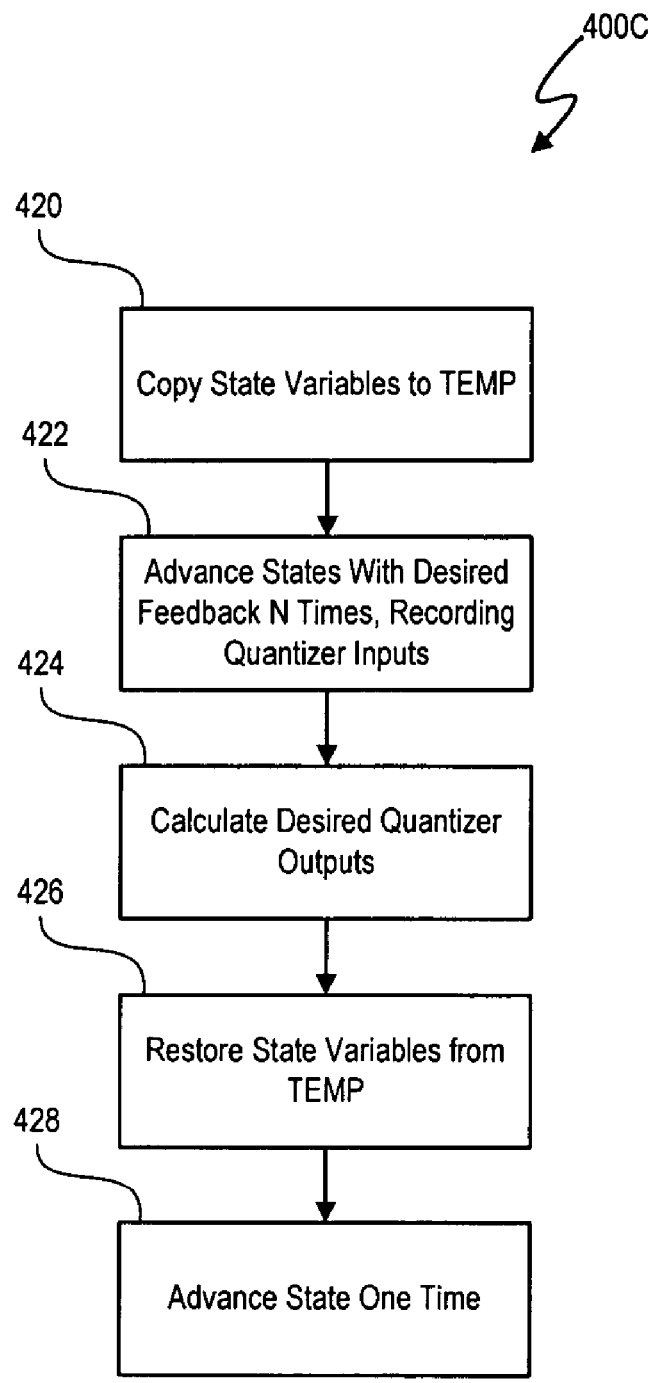
FIG. 4C (labeled prior art) depicts a technique to implement an IIR filter adapted for look-ahead operations.
Figure 5:
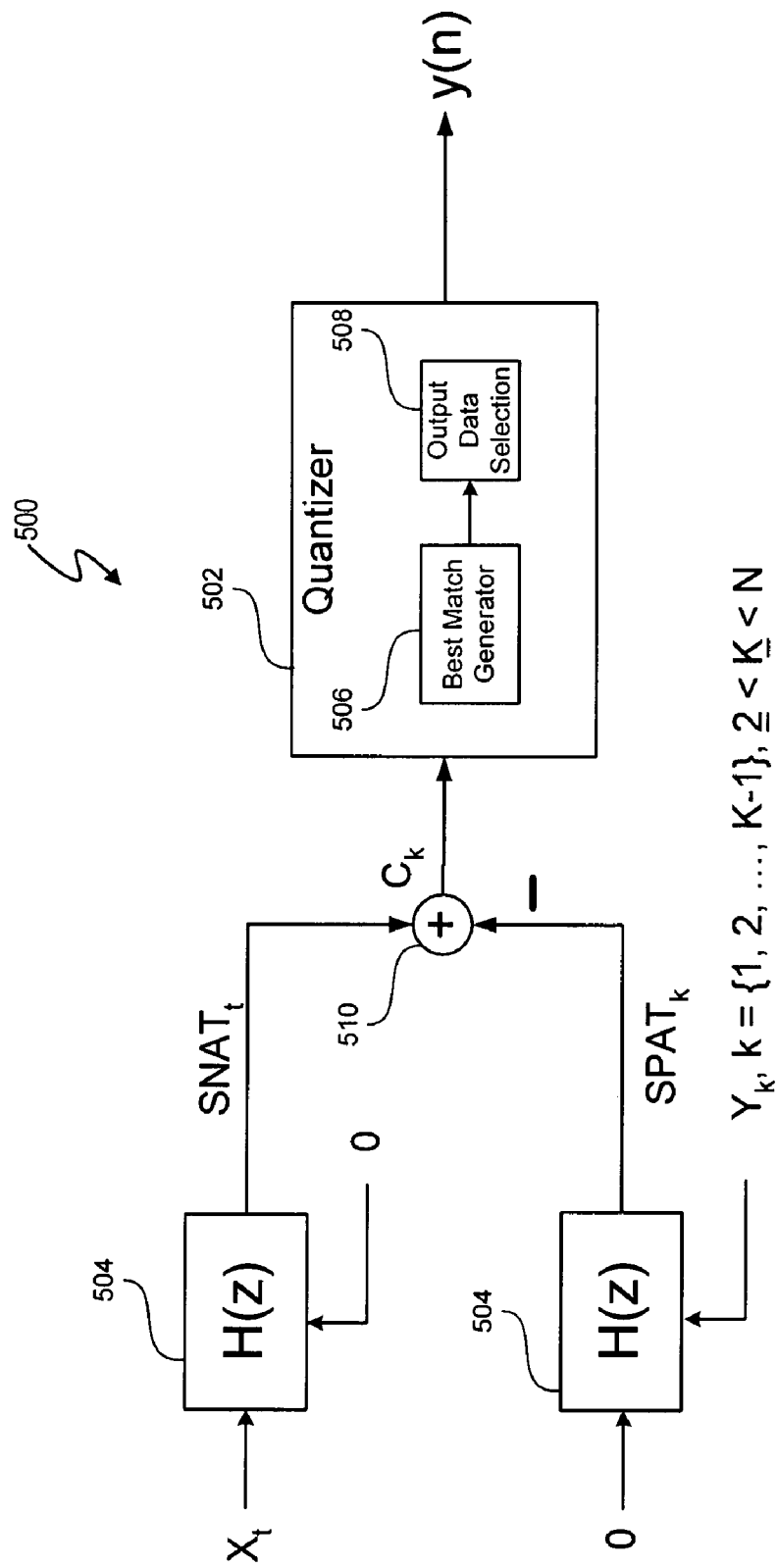
FIG. 5 depicts a look-ahead delta sigma modulator that utilizes superposition concepts to separate the input signal natural response SNAT from a set of pruned pattern response vectors.

FIG. 5 depicts a look-ahead delta sigma modulator 500 that utilizes superposition concepts to separate the input signal natural response $SNAT_t$ from each proximally matching pattern response vector $SPAT_k$, where "k" is an integer index, $2 \leq k \leq i$. In one embodiment, $i \in \{0, 1, \ldots, N-1\}$, and the set $\{0, 1, \ldots, N-1\}$ represents all N possible pattern response vectors. In another embodiment, the set of N possible pattern response vectors can be reduced to N' by, for example, eliminating pattern responses that lead to results that can not meet predetermined 'best match' criteria between the natural and pattern responses. In the context of sets, the equals symbol "=" is used interchangeably with the traditional "element of" symbol "∈". "$SPAT_k$" is a vector representing the forced pattern response of loop filter 504 to the $k^{th}$ output candidate vector $Y_k$, and $SNAT_t$ is a vector representing the loop filter natural response for input signal vector $X_t$. The set of pruned pattern response vectors ($SPAT_0$, $SPAT_1$, ..., $SPAT_{K-1}$) represents the pattern response vectors remaining after pruning, where K is an integer representing the total number of proximally matching pattern response vectors for time t and $1 \leq K \leq$ [number of natural response vector reference elements]. For a look-ahead depth of M, the input signal vector $X_t$ is defined in FIG. 2 and Table 1. The elements of the natural response vector $SNAT_t$ are $C_{X0}, C_{X1}, \ldots,$ and $C_{X(M-1)}$, where $C_{X0}$ is the natural response of filter 504 to input signal x(n) at time t, $C_{X1}$ is the natural response of filter 504 to input signal x(n+1) at time t, ..., $C_{X(M-1)}$ is the natural response of filter 504 to input signal x(n+M-1) at time t.

Filter output vector $C_k$ represents the response of loop filter 504 and equals the input signal natural response $SNAT_t$ minus the forced pattern response $SPAT_k$ for output candidate vector $Y_k$. Other vectors that approximate the output candidate vector $Y_k$ can also be used to determine the forced pattern response vector $SPAT_k$. The minus sign in the summation operation 510 is due to the convention used herein of assuming that the set of pruned forced pattern response vectors are the result of applying feedback candidate vectors with a positive sign at the filter input, and that the filter 504 utilizes a negative sign in the operating structure. This convention allows for the search to be considered as one of the minimum distances between $SNAT_t$ and the set of pruned pattern response vectors. In at least one embodiment, the loop filter 504 is chosen to optimize the noise shaping transfer function, and noise shaping loop filter 202 represents one exemplary topology of loop filter 504. A commonly assigned US. Patent Application entitled, "Look-ahead Delta Sigma Modulator Having an Infinite Impulse Response Filter with Multiple Look-ahead Outputs", filed Jan. 18, 2005, Ser. No. 11/037,311 inventor John L. Melanson (referred to herein as "Melanson II Patent") also describes an exemplary topology of loop filter 504. The Melanson II Patent is hereby incorporated by reference in its entirety. The actual topology of loop filter 504 is a matter of design choice, and loop filter 504 can be implemented using hardware, software, firmware, or any combination of two or more of the foregoing.

For each time t, the quantizer 502 uses a set of the filter output vectors $C_k$ to quantize the input signal vector $X_t$ and determine the quantization output value y(n) for input signal sample x(n). The best match generator 506 searches for the best match between the input signal natural response $SNAT_t$ and each pruned pattern response $SPAT_k$, and output selection module 508 chooses the value for quantization output value y(n). "Best" can be defined as closest matching in the signal band of interest. "Closest matching" can be predefined, for example, in a power sense (lowest distance), in a weighted distance sense, in a minimum/maximum sense, in a psycho-acoustically weighted sense, or in another desired measure. A "signal band of interest" is, for example, a frequency band containing a signal with data of interest. For example, an audio signal band of interest is approximately 0 Hz to 25 kHz. Thus, in one embodiment, the "best" output signal pattern Y[n] is the pattern Y[n] such that the loop filter output response $C_k$ has the lowest power. Determining the loop filter output response with the lowest signal power $C_{k\,min}$ and choosing the quantization output value y(n) are illustratively described in more detail in the Melanson III Patent and in commonly assigned U.S. patent application Ser. No. 10/875,920, entitled "Signal Processing with a Look-ahead Modulator Having Time Weighted Error Values", filed on Jun. 22, 2004, and inventor John L. Melanson (referred to herein as the "Melanson IV Patent"). The signal processing system described herein can be adapted to determine the best, closest matching output signal pattern under varying constraints and is not limited to the constraints of "best" and "closest matching" set forth herein, but rather constraints can be defined to accomplish desired goals. Additionally, it is not necessary to only select the output for one sample per search, two or more samples may be selected, and the filter advanced appropriately for the selected number of samples.

Figure 6:
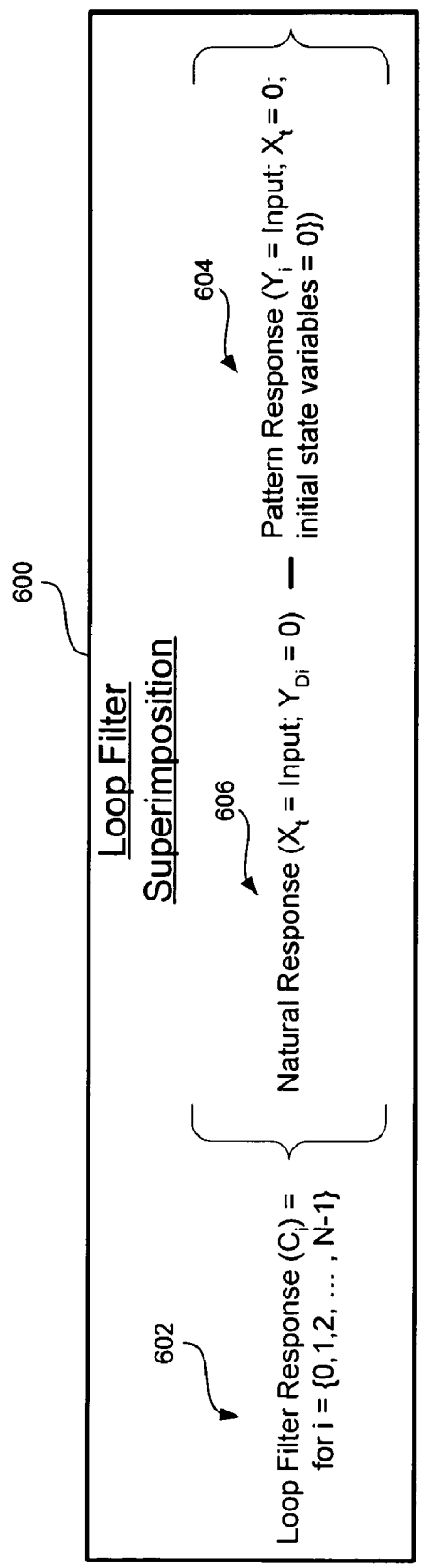
FIG. 6 depicts the superposition of a loop filter response.

FIG. 6 depicts the superposition 600 of the loop filter response $C_i$ 602 for each output candidate vector $Y_i$ and each input signal vector $X_t$. In one embodiment, the set of all pattern responses SPAT 604 represents the set of all responses of loop filter 504 for each output candidate vector $Y_i$. As described in more detail below, calculation of some of the pattern responses produce duplicate calculations in determining quantization output value y(n). Duplicate calculations can be eliminated. Additionally, some pattern responses can lead to results that will not meet predetermined 'best match' criteria between the natural and pattern responses and, thus, also do not have to be considered. Accordingly, the total number of possible output candidate vectors, and, thus, the total number of possible pattern response vectors, can be chosen from the set $\{0, 1, \ldots, N'-1\}$, which is a subset of the set $\{0, 1, \ldots, N-1\}$. The pattern response for each respective output candidate vector $Y_i$ can be determined by setting the input signal to zero (0), setting the initial state variables of loop filter 504 to zero (0), and determining the loop filter pattern response $SPAT_i$. Because the pattern responses are independent of the input signal data values, each pattern response $SPAT_t$ can be precomputed once and stored for continual use in determining a pruned set of pattern response vectors and in determining quantization output value y(n). Precomputing the set of pruned pattern responses once and reusing the precomputed responses reduces the amount of computations used to determine quantization output value y(n). In a circuit implementation, storing precomputed responses in a memory reduces the quantity of circuitry needed to quantize each input signal vector $X_t$ of input signal X(n).

The superposition 600 of loop filter response $C_k$ 602 also includes the natural response of loop filter 504 to each input signal vector $X_t$. The input signal natural response vector $SNAT_t$ is determined by quantizer 500 once for each input signal vector $X_t$ by setting the feedback in loop filter 504 to zero (0) and determining the filter 504 response to input signal vector $X_t$.

Figure 7:
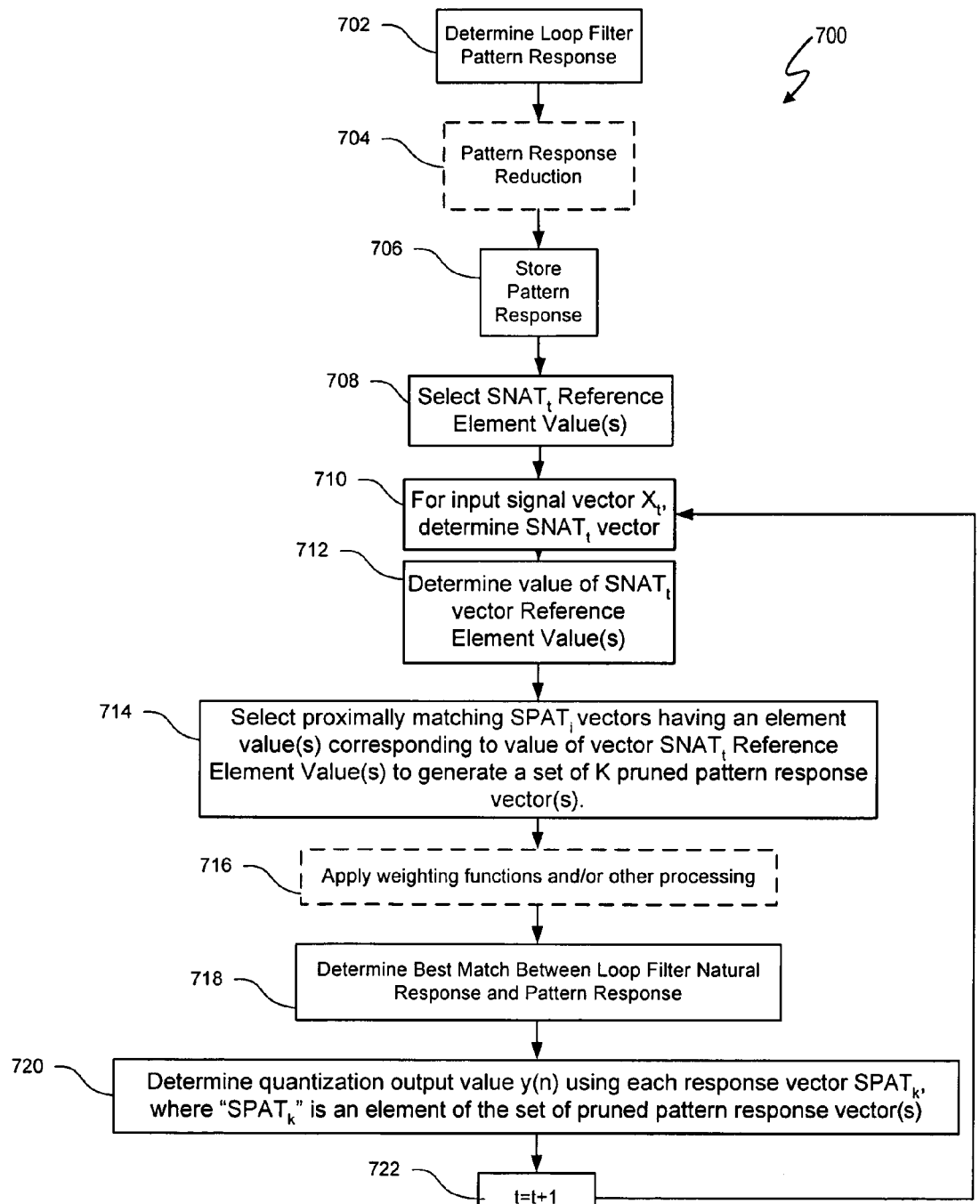
FIG. 7 depicts a pruning and quantization process.

FIG. 7 depicts an exemplary pruning and quantization process 700 to prune the set of possible pattern response vectors to determine a set of pruned pattern response vectors and determine a quantization output value y(n). The pruning and quantization process 700 can include a pattern response vector reduction technique to reduce the number of possible pattern response vectors used to determine the quantization output value y(n). The reduction technique eliminates pattern response vectors that result in mathematically identical solutions as at least one non-eliminated pattern response vector. The reduction technique can also eliminate pattern response vectors that by definition cannot change the outcome when determining quantization output value y(n). Removing pattern response vectors from consideration by look-ahead delta sigma modulator 500 in determining the quantization output value y(n) allows the quantization process 700 to process fewer pattern response vectors to determine quantization output value y(n) and, thus, complete the quantization process more quickly than using the set of N' (or N if the foregoing described pattern response reduction techniques are not used).

The pruning and quantization process 700 includes pruning operations that determine which pattern response vectors from the set of possible pattern response vectors are not considered when determining the quantization output value y(n) for time t. In at least one embodiment, look-ahead delta sigma modulator 500 determines the set of pruned pattern response vectors by comparing a predetermined reference element value of the natural response vector $SNAT_t$ to a corresponding value of each the pattern response vectors. Pattern response vectors having a corresponding value within a prescribed linear distance of K form the set of P pruned pattern response vectors from which look-ahead delta sigma modulator 500 determines a quantization output value y(n). In another embodiment, pruning and quantization process 700 uses more than one natural response vector $SNAT_t$ element to compare to corresponding elements of the pattern response vectors to form the set of P pruned pattern response vectors. The prescribed maximum linear distances, $P_0, P_1, \ldots, P_H$, between each natural response vector $SNAT_t$ reference element value and corresponding pattern response vector element value can be the same or different. The prescribed linear distances are chosen empirically using, for example, a representative test input signal to determine a value(s) of P that results in an acceptable signal-to-noise ratio. In another embodiment, rather than using a prescribed linear distance, a prescribed number of pattern response vectors that have the closest linear distance to the natural response reference value(s) are selected as the set of pruned pattern response vectors. Setting a prescribed number of L pattern response vectors in the set of pruned pattern response vectors provides a fixed amount of calculation time, where L is an integer representing the prescribed number. In a further embodiment, the foregoing prescribed distance and prescribed number techniques to determine the contents of the pruned response vector set are combined. The combination technique includes include only a prescribed number of pattern response vectors having an element value within a prescribed linear distance from the corresponding to the natural response vector reference element within a certain linear distance, with only the linearly closest pattern response vectors being included in the pruned pattern response vector set.

Figure 8A:
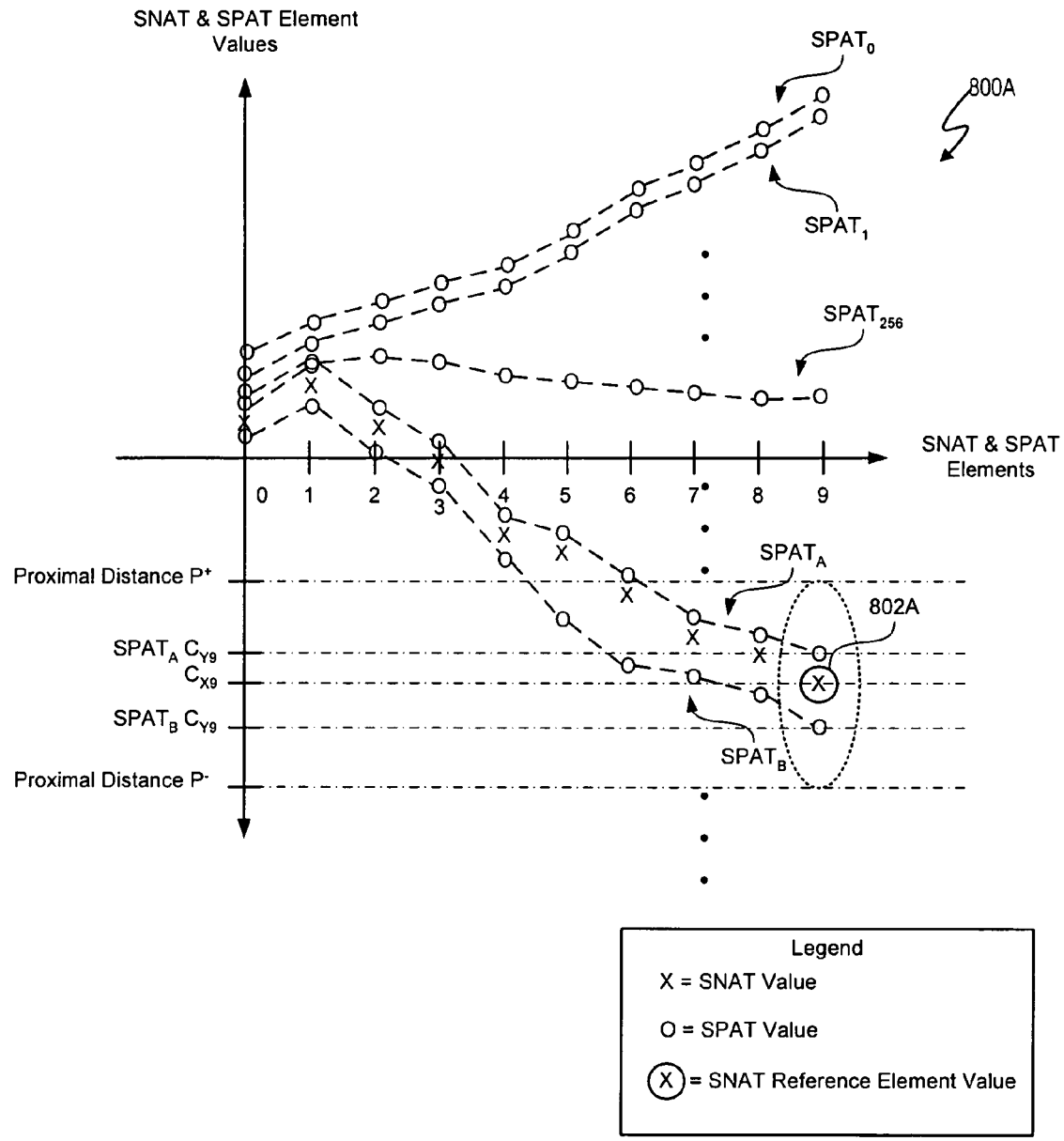
FIGS. 8A and 8B depict natural response vector and pattern response vector element pruning graphs.
Figure 8B:
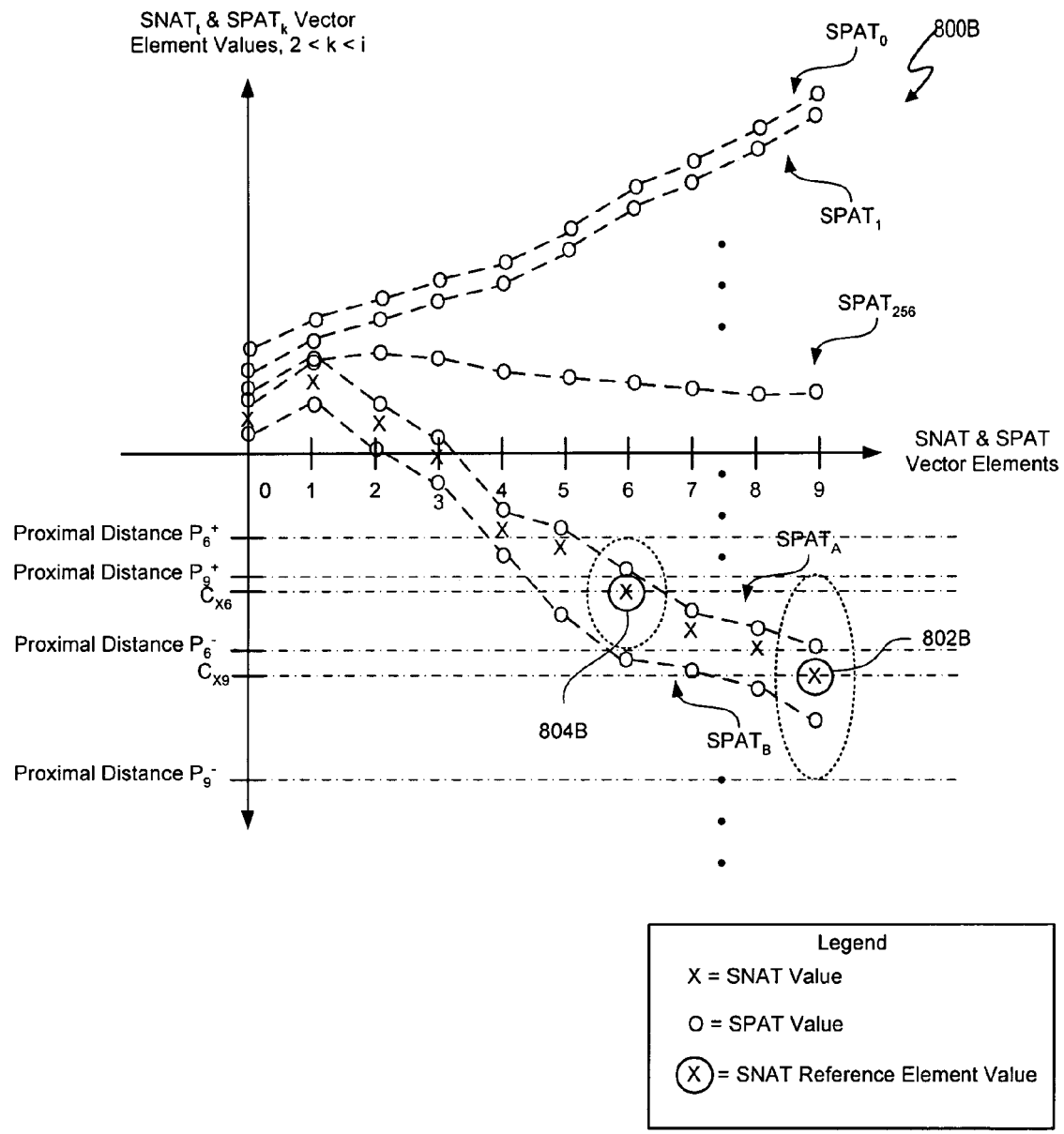
Figure 8C:
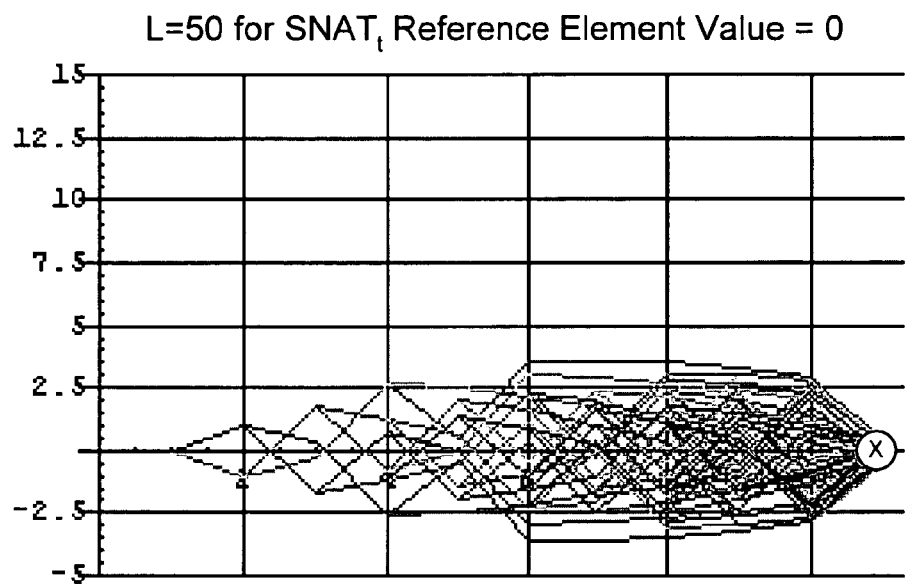
FIGS. 8C–8H depict pattern response vector element pruning graphs.
Figure 8D:
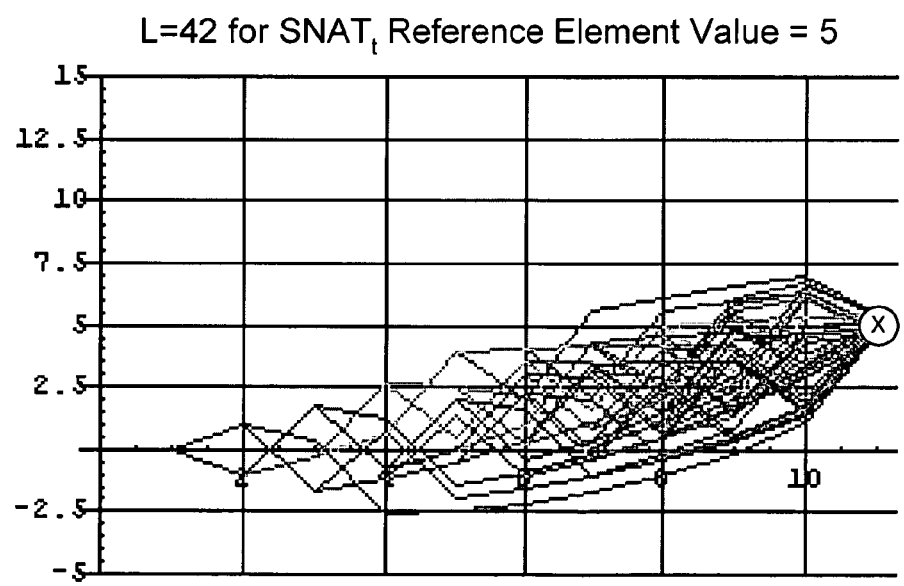
Figure 8E:
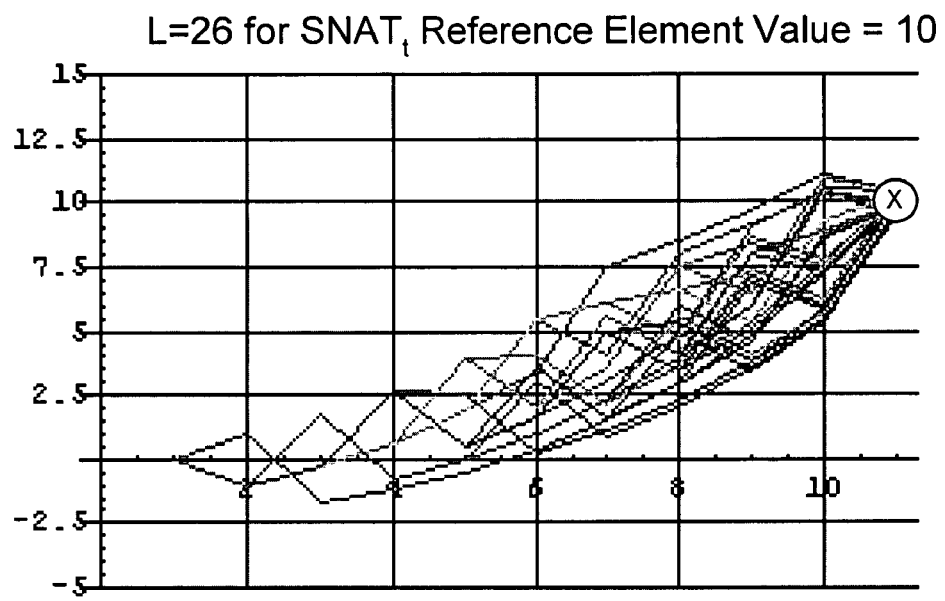
Figure 8F:
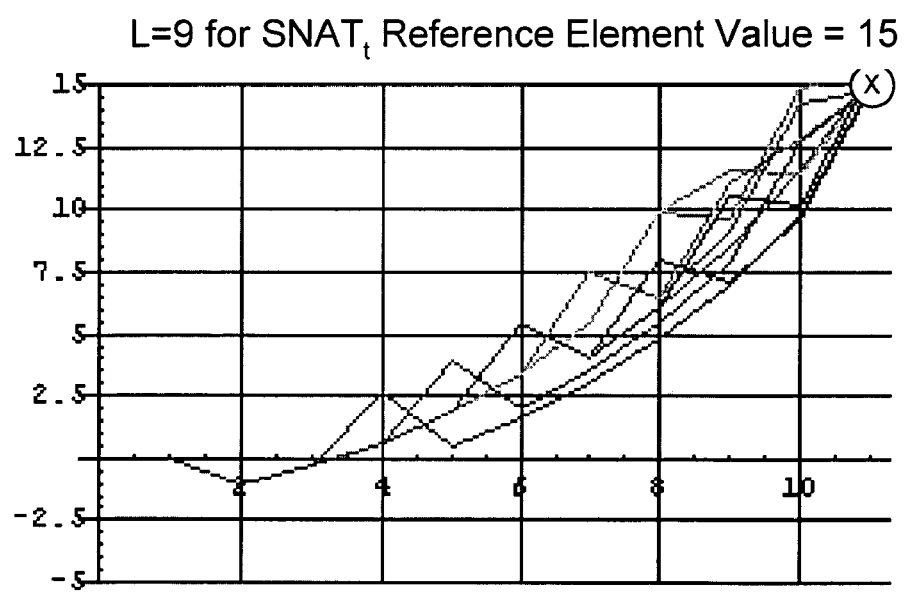

FIG. 8A depicts a natural response vector and pattern response vector element pruning graph 800A. The pruning graph 800A graphically represents one embodiment of pruning a set of pattern response vectors to determine a pruned set of pattern response vectors using a single natural response vector reference element. FIG. 8B depicts a natural response vector and pattern response vector element pruning graph 800B. Pruning graph 800B graphically represents one embodiment of pruning a set of pattern response vectors to determine a pruned set of pattern response vectors using two natural response vector reference elements. Pruning and quantization process 700 is described below with reference to FIGS. 7, 8A, and 8B. Pruning and quantization process 700 can be implemented in hardware, software, or a combination of hardware and software.

Operation 702 determines the pattern responses SPAT for each output candidate vector $Y_i$ as described above. In one embodiment of operation 702, a pattern response is computed for each $Y_i$, i={1, 2, ..., N-1}. In another embodiment, some of the pattern responses produce duplicate results. Operation 704 indicates that the redundant information in the pattern response vectors does not need to be stored. As an example, the response to {+1,+1,-1,-1} is the arithmetic inverse of the response to {-1,-1,+1,+1}. Additionally, the responses to {+1,+1,-1,-1} and {+1,+1,-1,+1} have the same three first values. Operation 706 stores the precomputed pattern responses for subsequent use with all input signal vectors $X_t$.

In operation 708, one or more natural response reference elements are selected. In one embodiment, the most future element of the natural response vector. $SNAT_t$ is selected as the natural response reference element. Generally, the greatest divergence of pattern response vectors correlates to the most future elements of the pattern response vectors. Thus, selecting the most future element of the natural response vector $SNAT_t$ as the reference element generally results in the smallest set of pruned pattern response vectors. FIGS. 8A and 8B represent a pruning graph for a look-ahead depth of 10. The tenth element, element 9 (when numbering from 0 through 9), of the natural response vector is selected as the natural response vector reference element in pruning graphs 800A and 800B. Pruning graph 800B also includes element 6 as a second natural vector reference element. Choosing multiple reference elements allows operation 700 to potentially decrease the number of pruned pattern response vectors but also uses multiple proximal matching operations. Without any reduction, the possible set of pattern response vectors equals $2^{10}=1024$. By applying the pattern reduction techniques described herein, the number of possible pattern response vectors can generally be reduced to less than half of $2^M$, where M=look-ahead depth.

Operation 710 determines the natural response vector $SNAT_t$ for the input signal vector $X_t$ as described above. From the determined natural response vector $SNAT_t$, operation 712 selects the reference element value of the natural response vector $SNAT_t$. The reference element value for the selected reference element is the value of the natural response vector $SNAT_t$ for the selected element. In pruning graph 800A, the selected reference element is element 9, and the value of element 9 of the natural response vector $SNAT_t$ is represented by $C_{X9}$. In an actual pruning operation, $C_{X9}$ is a real number. In pruning graph 800B, the selected reference elements are elements 6 and 9, and the respective values of elements 6 and 9 of the natural response vector $SNAT_t$ are represented by $C_{X6}$ and $C_{X9}$.

Operation 714 selects the proximally matching pattern response vector(s) $SPAT_k$, from the set of possible pattern response vectors that include an element value corresponding to the natural response vector $SNAT_t$ reference element that proximally matches the corresponding reference element value. If multiple natural response vector $SNAT_t$ reference elements are used to prune the pattern response vectors, then operation 714 selects the pattern response vector(s) $SPAT_k$, from the set of possible pattern response vectors, that include element value(s) corresponding to the natural response vector $SNAT_t$ reference elements that proximally matches the corresponding reference element values. In one embodiment, a pattern response vector $SPAT_k$ element proximally matches a corresponding natural response vector $SNAT_t$ reference element if both Equations 1 and 2 are satisfied:

[$SPAT_k$ element value−reference element value]$\leq P^+$: Equation 1

[$SPAT_k$ element value−reference element value]$\geq P^-$: Equation 2.

The proximal distances $P^+$ and $P^-$ are generally the negatives of each other but can be different values. If $P^+=-P^-$, then a pattern response vector $SPAT_k$ element proximally matches a corresponding natural response vector $SNAT_t$ reference element if abs[$SPAT_k$ element value−reference element value]$\geq P$, where $P=P^+=-P$ and "abs[ ]" represents the absolute value of the result within the brackets.

In another embodiment, a pattern response vector $SPAT_k$ element proximally matches a corresponding natural response vector $SNAT_t$ reference element if the linear distance between the $SPAT_k$ element and the $SNAT_t$ reference element is one of the L shortest, where L is a maximum prescribed number of vectors in a set of pruned pattern response vectors.

Operation 714 can be implemented in any of a variety of ways. For example, each pattern response vector $SPAT_k$ element value could be directly compared with the corresponding natural response vector $SNAT_t$ reference value to determine if Equations 1 and 2 are both satisfied. In another embodiment, since the set of possible pattern response vectors can be precomputed, the set of possible pattern response vectors can be stored in a number of tables equal to the number of reference elements. For each table, the pattern response vectors can be sorted by element values for the element corresponding to the reference element associated with the table. Then, when determining proximal matches based upon a maximum/minimum linear distances, operation 714 finds the two pattern response vectors having the maximum and minimum values of [$SPAT_k$ element value—reference element value] while still satisfying Equations 1 and 2. Operation 714 selects those two pattern response vectors and every pattern response vector in between. When determining proximal matches based upon a prescribed number of vectors in the pruned pattern response vector set, the pattern response vectors can be sorted based upon the linear distance between element values for the pattern response vector element corresponding to the natural response vector reference element associated with the table. The prescribed number of pattern response vectors having the shortest distances are selected as members of the pruned pattern response vector set.

Referring to FIG. 8A, the reference value element of $SNAT_t$ is chosen as the most future element, element 9, and the value of the reference element 802A is CX9. Only SPATA and SPATB include respective element 9 values SPATA CY9 and SPATB CY9 that satisfy Equations 1 and 2. Thus, the pruned set of pattern response vector(s) is {SPATA, SPATB}.

Referring to FIG. 8B, the reference value elements of $SNAT_t$ are chosen as element 6 and the most future element, element 9. The respective values of reference elements 804B and 802B are $C_{X6}$ and $C_{X9}$. Only $SPAT_A$ includes respective element 6 and 9 values $SPAT_A$ $C_{Y6}$ and $SPAT_A$ $C_{Y9}$ that satisfy Equations 1 and 2. Thus, the pruned set of pattern response vector(s) is $\{SPAT_A\}$.

Each $SPAT_i$ vector from the set of possible pattern response vectors that does include an element value(s) that proximally match the corresponding value(s) of the natural response vector $SNAT_t$ reference element(s) are not used in the selection of the quantization output value y(n) for time t.

Optional operation 716 applies weighting vectors, as, for example, described in the Melanson III Patent, to each loop filter response $C_k$. Each loop filter response $C_k$ is determined from the natural response vector $SNAT_t$ and the set of proximally matching pattern response vectors $\{SPAT_{PM0}, SPAT_{PM1}, \ldots, SPAT_{PM\ P-1}\}$ as described above. Other processing includes minimizing quantization noise as described in the Melanson I Patent.

Operation 718 determines the best match for each input signal vector $X_t$ between the set of proximally matched pattern responses $\{SPAT_{PM0}, SPAT_{PM1}, SPAT_{PM\ P-1}\}$ and the loop filter input signal natural response $SNAT_t$ for input signal vector $X_t$.

If 'best match' is predefined to mean the minimum loop filter output response power for each input signal vector $X_t$, then the power of each vector $C_k$ is determined for each input signal vector $X_t$. The power of $C_k$ is $C_k^2 = (SNAT_t - SPAT_k)^2 + SNAT_k^2 - 2 \cdot SNAT_t \cdot SPAT_k - SPAT^2$.

For a one-bit look-ahead delta sigma modulator, in operation 720 the quantization output value y(n) is selected from the leading bit of the output candidate vector $Y_k$ from which the minimum filter response $C_{k\ min}$ was generated. In at least one embodiment, the quantization output value y(n) is the leading bit of the output candidate vector $Y_k$ from which the 'best match' filter response $C_{k\ min}$ was generated.

Operation 722 advances pruning and quantization process 700 to quantize the next input signal $X_t$ for sample t=t+1 in operation 710. The return path from operation 722 to operation 710 illustrates that the pattern responses SPAT, in one embodiment, need only be computed once.

In a binary system, the number of unique output candidate vectors for a depth of M is $2^N$. When determining the best match between the natural response vector and the proximally pattern response vectors, the number of pattern responses considered by best match generator 506 can be reduced to eliminate from consideration any pattern responses that provide duplicate outcomes from which to select an output value. For example, as the loop filter is a linear system, the response to −x is the negative of the response to x. This relationship can be used to eliminate one-half of all pattern responses by pattern response reduction 704. For example, when depth M=4, two of the output candidate vectors are $Y_0=[-1, -1, -1, -1]$ and $Y_{15}=[+1, +1, +1, +1]$. $SPAT_0$, corresponding to the loop filter response to output candidate vector $Y_0$, and $SPAT_{15}$, corresponding to the loop filter response to output candidate vector $Y_{15}$, are arithmetic inverses.

Further simplification of the quantization calculations can be achieved by eliminating calculations that have no impact when determining the best match between the loop filter input signal natural response $SNAT_t$ and the loop filter pattern responses SPAT. This reduction can be based on arithmetic identities. When the predetermined best match criteria is identifying the minimum loop filter response output power, $C_{i\ min}^2 = [(SNAT_t - SPAT_i)^2 = SNAT_t^2 - 2 \cdot SNAT_t \cdot SPAT_i - SPAT_i^2]_{min}$, $SNAT_t^2$ is a constant for all $C_k$, and, thus has no effect on determining $C_{k\ min}^2$ and can be eliminated from the minimum power computation. Furthermore, $SPAT_k^2$ is a constant for each pattern response, and can, thus, be precomputed and stored in a memory and recalled for the power calculation. The "2" multiplier in "$2 \cdot SNAT_t \cdot SPAT_k$" need not be included in the power calculation because doubling $SNAT_t \cdot SPAT_k$ has no effect on determining $C_{k\ min}^2$. (although the precomputed $SPAT_k$ values are scaled by ½). Thus, the calculations of $C_k^2$ can be significantly simplified by eliminating calculations that will not affect $C_{k\ min}^2$. The computation now consists of a vector dot product (sum of products) and the addition of a constant.

FIGS. 8C–8F collectively depict a complete set of pattern response vectors for a one-bit delta sigma modulator. FIGS. 8C through 8F illustrate the convergence of the most future element value of a subset of pattern response vectors towards respective natural response vector reference elements. Each subset of pattern response vectors respectively depicted in FIGS. 8C through 8F form a pruned set of L pattern response vectors for the natural response vector having the reference element respectively depicted in FIGS. 8C through 8F.

Figure 8G:
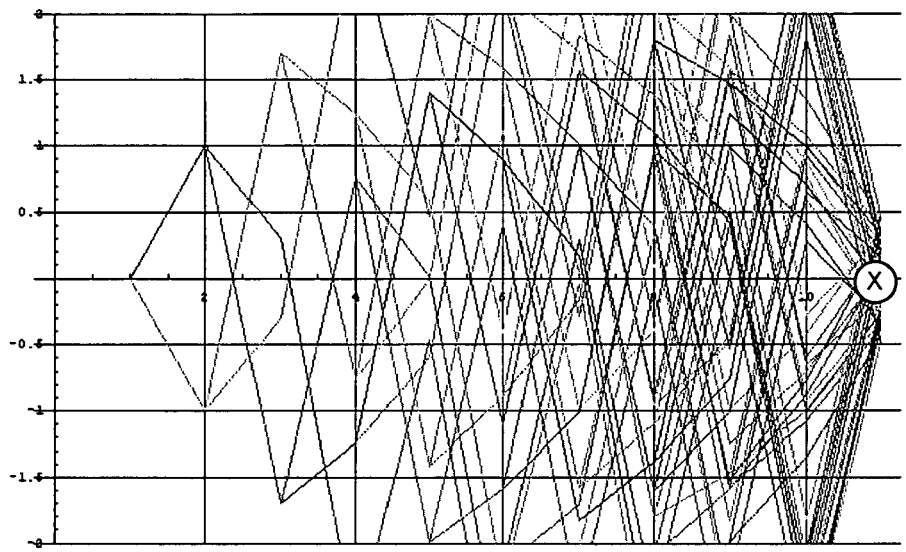
Figure 8H:
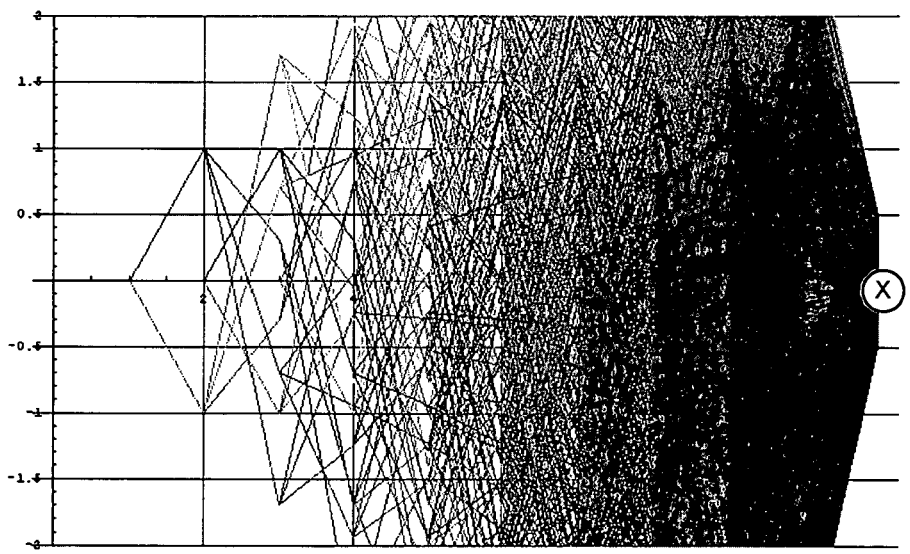

FIGS. 8G and 8H depict the variation in the options available when using a multi-bit (more than two levels) versus a one-bit (two levels) look-ahead delta sigma modulator. FIGS. 8G and 8H illustrate the convergence of the most future element value of a subset of pattern response vectors towards the same natural response vector reference element value of 0. FIG. 8G represents a graph of pattern response vectors for a one-bit look-ahead delta sigma modulator, and FIG. 8H represents a graph of pattern response vectors for a 1½ bit (3 level) look-ahead delta sigma modulator. The multi-bit look-ahead delta sigma modulator includes a greater number of pattern responses converging upon the natural response vector reference element. FIGS. 8G and 8H also represent the proximal matching technique of selecting a prescribed number of vectors in a pruned pattern response vector set.

Figure 9:
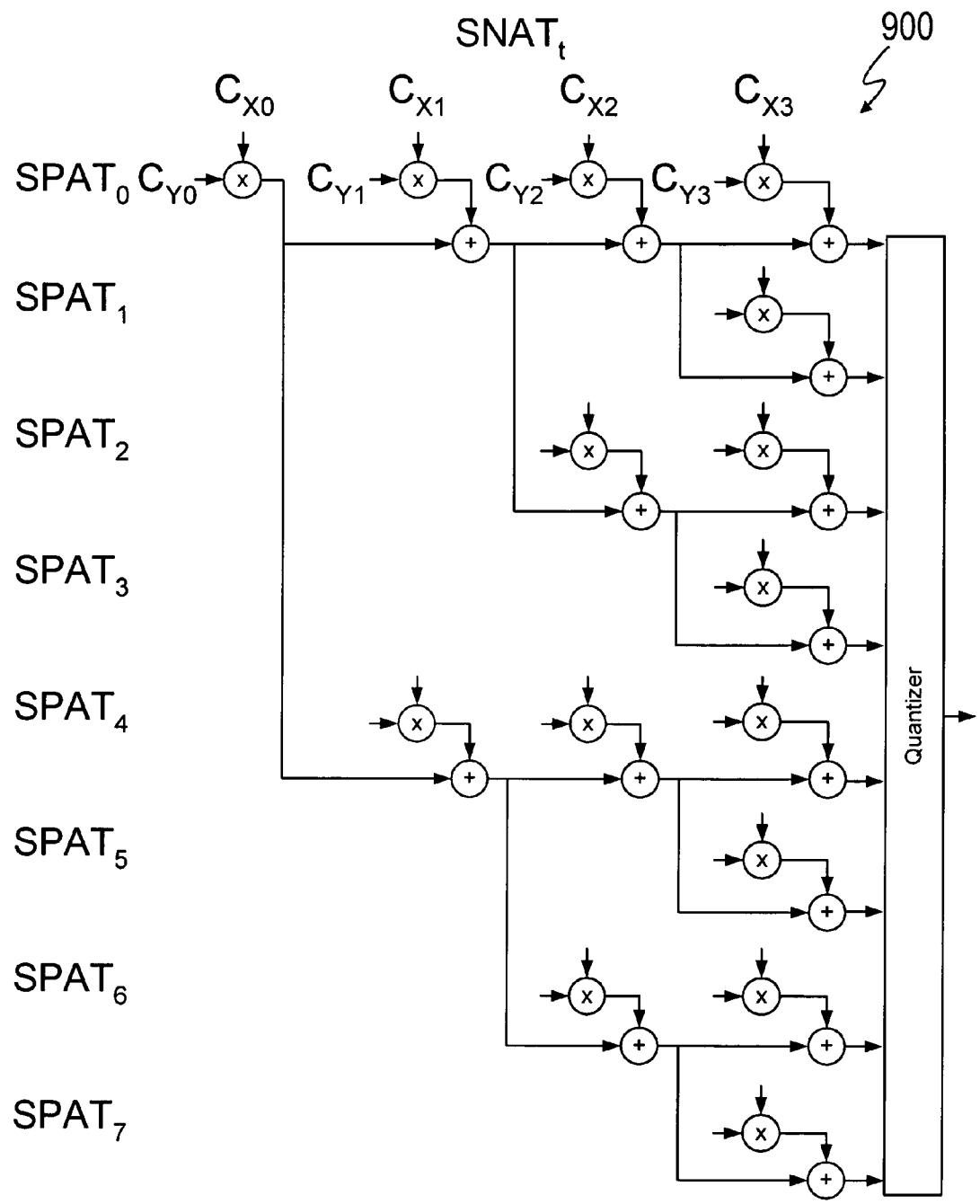
FIG. 9 depicts a computation reduction scheme.

FIG. 9 schematically depicts a computation reduction scheme 900 that reduces the number of computations used to select an output value in a look-ahead delta sigma modulator. Computation reduction scheme 900 represents one embodiment of operation 704. Quantization computations can be further reduced by performing otherwise repetitive calculations only once. For all sets of $SPAT_i$, there are only two (2) values for the first element, four (4) for the second element, etc. This insight can be demonstrated in a straight forward manner, as there are only two possible values for the first element (−1, +1) of the $SPAT_i$ vector, hence only two possible filter responses. Similarly, there are only 4 possible values for the first two elements of the feedback. These predecessor multiplications can be shared across all ½, ¼, etc. of the total computations. Sharing predecessor multiplications reduces computation by ½. Together with the −/+ anti-symmetry of the total pattern, the computation is reduced by a factor of 4. Repetitive additions can also be shared to further reduce the number of computations. The reduction scheme depicts computation reduction for a depth of 4 can be easily extended using the same pattern as depicted in FIG. 8 for a look-ahead depth of M.

Computation reduction scheme 900 includes multipliers represented by "⊗" and adders represented by "⊕". $C_{X0}$, $C_{X1}$, $C_{X2}$, and $C_{X3}$ are the output values of filter 504 represented by vector $SNAT_t$ for time "t". $SPAT_0$ through $SPAT_7$ are respectively the output values of the eight output candidate vectors, $Y_0$ through $Y_7$. $SPAT_0$ through $SPAT_7$ all have anti-symmetry counterparts and, thus, are not needed to calculate the output value. Additionally, although not depicted in this embodiment, constants and variables can be included in the computations to modify $SPAT_i$. In one embodiment, $SPAT_0$ is the filtered response to $Y_0=\{-1, -1, -1, -1\}$, $SPAT_1$ is the filtered response to $Y_1=\{-1, -1, -1, +1\}$, $SPAT_2$ is the filtered response of $Y_2=\{-1, -1, +1, -1,\}$ and so on with $SPAT_7$ representing the filtered response to $Y_7=\{-, +1, +1, +1\}$. Computation reduction scheme computes the dot product of SNAT and $SPAT_0$ and sums the result. For the dot product of $SNAT_t$ and $SPAT_1$, the first three multiplications and additions, i.e. $C_{X0} \times C_{Y0} + C_{X1} \times C_{Y1} + C_{X2} \times C_{Y2}$, are identical predecessor calculations from $SNAT_t$ times $SPAT_0$ and are, thus, not repeated. For the dot product of SNAT and $SPAT_2$ the two multiplications and additions, i.e. $C_{X0} \times C_{Y} + C_{X1} \times C_{Y1}$, are identical for SNAT and $SPAT_0$ and are, thus, not repeated, and so on. Thus, in general, the number of calculations used to determine the quantizer output value y(n) can be significantly reduced by not performing redundant multiplications and storing repetitively used summation results. Computation reduction scheme 900 can be modified in any number of ways by, for example, retaining some repetitive calculations to reduce memory recall operations.

The computation reduction scheme 900 is used by operation 720 by substituting each pattern response vector $SPAT_k$ from the set of K pruned pattern response vectors for the corresponding pattern response vector $SPAT_i$ in FIG. 9 and performing any predecessor calculations used by the proximally matching pattern response vectors. For example, assume proximally matching pattern response vector $SPAT_A$ in FIG. 8A corresponds to $SPAT_4$, and proximally matching pattern response vector SPATB corresponds to $SPAT_6$. The calculation of natural response vector $SNAT_t$ times pattern response vector $SPAT_4$ would also include calculating $C_{Y0}$ times $C_{X0}$ because the calculation of $C_{Y0}$ and $C_{X0}$ is a predecessor calculation for pattern response vector $SPAT_4$.

Figure 10:
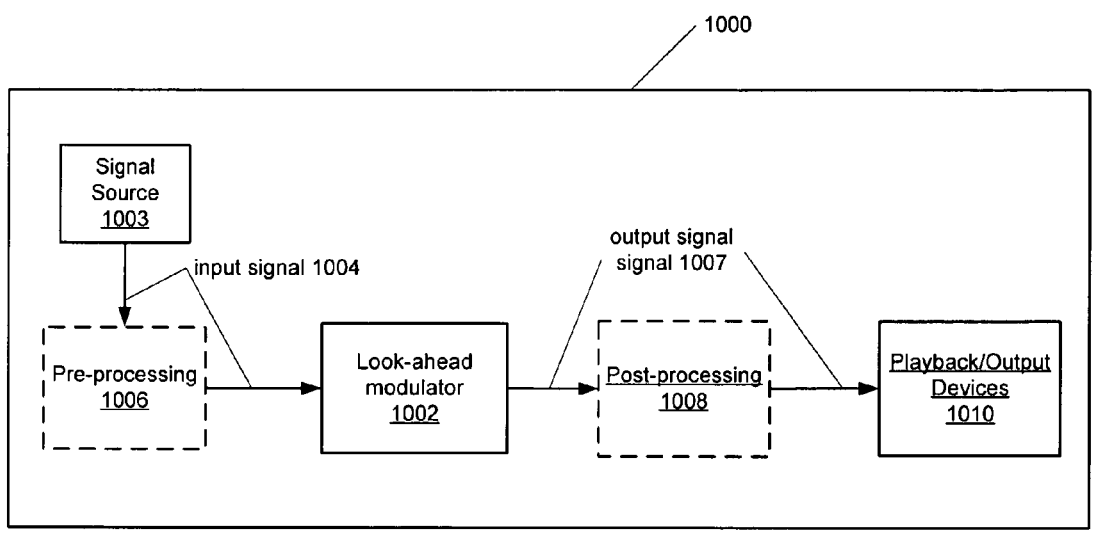
FIG. 10 depicts a signal processing system that includes a look-ahead modulator, an output device and process, and an output medium.

Referring to FIG. 10, signal processing system 1000 depicts one embodiment of a signal processing system that includes look-ahead modulator 500. Signal processing system 1000 is particularly useful for high-end audio applications such as super audio compact disk ("SACD") recording applications. Signal processing system 1000 processes an input signal 1004 generated by an input signal source 1003. The input signal 1004 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1004 may be an audio signal, a video signal, an audio plus video signal, and/or other signal type. Generally, input signal 1004 undergoes some preprocessing 1006 prior to being modulated by look-ahead modulator 1002. For example, pre-processing 1006 can involve an interpolation filter to oversample a digital input signal 1004 in a well-known manner. Pre-processing 1006 can include an analog-to-digital converter to convert an analog input signal 1004 into a digital signal. Pre-processing 1006 can also include mixing, reverberation, equalization, editing, out-of-band noise filtering and other filtering operations.

In the digital domain, pre-processing 1006 provides discrete input signals X[n] to look-ahead modulator 1002. Each discrete input signal x[n] is a K-bit signal, where K is greater than one. As previously described in more detail, look-ahead modulator 500 processes input signals X[n] and candidates Y[n] to determine an output signal 1007. Output signal 1007 is, for example, a collection of one-bit output values. The output signal 1007, thus, becomes an encoded version of the input signal 1004.

Figure 11:
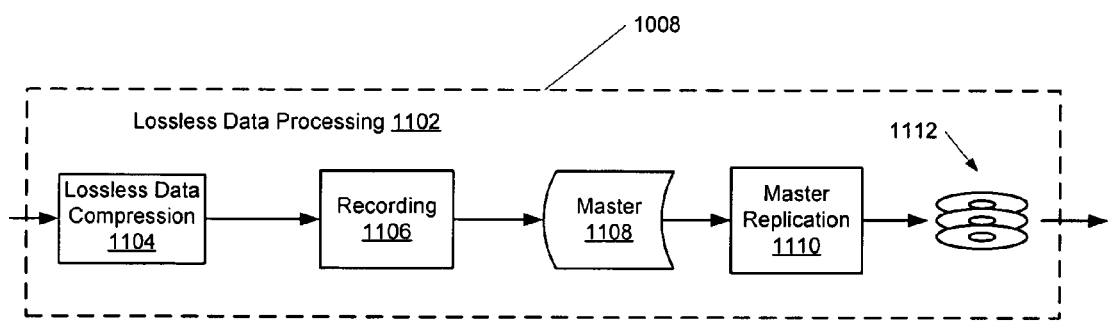
FIG. 11 depicts post-processing operations in an embodiment of the signal processing system of FIG. 10.

Referring to FIGS. 10 and 11, signal processing system 1000 typically includes post-processing 1008 to post-process the output signal 1007 of look-ahead modulator 500. Post-processing 1008 can include lossless data processing 1102. For SACD audio mastering, there is a lossless data compression stage 1104, followed by a recording process 1106 that produces the actual pits that are burned into a master storage medium 1108. The master storage medium 1108 is then mechanically replicated using master replication 1110 to make the disks (or other storage media) 1112 available for widespread distribution. Disks 1112 are, for example, any variety of digital versatile disk, a compact disk, tape, or super audio compact disk. Playback/output devices 1010 read the data from the disks 1112 and provide a signal output in a format perceptible to users. Playback/output devices 1010 can be any output devices capable of utilizing the output signal 1007. Thus, the storage media 1108 and 1112 include data encoded using signal modulation processes achieved using look-ahead modulator 500.

Although the present invention has been described in detail, it should be understood that various changes, substitutions and alterations can be made hereto without departing from the spirit and scope of the invention as defined by the appended claims. For example, pruning and quantization process 700 can be used in conjunction with conventional pruning techniques, which would reduce the fidelity of the output data but can also further simply calculations.

What is claimed is:

1. A method of processing input signal data using a look-ahead delta sigma modulator of depth N using natural and pruned pattern loop filter responses, wherein N is greater than or equal to two, the method comprising:

determining a set of pattern responses of a loop filter of the look-ahead delta sigma modulator for each output candidate vector by setting signal input data to the loop filter of the delta sigma modulator to at least approximately zero and filtering a set of output candidate vectors;

determining a natural response of the loop filter of the look-ahead delta sigma modulator by setting feedback data to the loop filter to at least approximately zero and filtering a set of input data signal samples;

pruning the set of pattern responses to determine a set of one or more pruned pattern responses; and quantizing each input signal data sample by applying predetermined decision criteria to determine a best match between a member of the set of one or more pruned pattern responses and the natural response and selecting quantization output data from the output candidate vector associated with the pruned pattern response used to determine the best match.

2. The method as in claim 1 wherein the natural response and each pattern response are respective vectors and pruning the set of pattern responses comprises:

selecting each pattern response vector that includes a vector element that proximally matches a corresponding reference element of the natural response vector.

3. The method as in claim 2 wherein selecting each pattern response vector that includes a vector element that proximally matches a corresponding reference element of the natural response vector comprises:
determining if the vector element of the pattern response vector that corresponds to the reference element of the natural response vector is within a prescribed linear distance.

4. The method as in claim 2 wherein selecting each pattern response vector that includes a vector element that proximally matches a corresponding reference element of the natural response vector comprises:
determining a prescribed number of pattern response vectors that include respective elements having shortest linear distances to a corresponding natural response vector reference element value.

5. The method as in claim 1 wherein:
applying the predetermined decision criteria to determine the best match comprises determining a lowest power of the difference between a member of the set of one or more pruned pattern responses and the natural response; and
selecting a quantization output value from the output candidate vector associated with the pruned pattern response used to determine the best match comprises selecting the output candidate vector associated with the lowest power difference.

6. The method as in claim 5 wherein determining a lowest power match between one of the pruned pattern responses and the natural response comprises determining a dot product for each pruned pattern response and the natural response.

7. The method as in claim 1 wherein:
applying the predetermined decision criteria to determine the best match comprises determining a lowest power match between a member of the set of one or more pruned pattern responses and the natural response wherein at least one element of the pruned pattern response is weighted with a weight different than any other element of the pruned pattern response; and
selecting output data from the output candidate vector associated with the pruned pattern response used to determine the best match comprises selecting the output candidate vector associated with the lowest power match.

8. The method as in claim 1 wherein the set of pattern responses excludes pruned pattern responses that provide duplicate best match determinations.

9. The method as in claim 1 wherein determining the set of pattern responses of the loop filter of the look-ahead delta sigma modulator further comprises precomputing the set of pattern responses before quantizing each input signal data sample.

10. The method of claim 9 further comprising:
storing the precomputed set of pattern responses in a memory for use in subsequently quantizing each input signal data sample.

11. The method as in claim 1 further comprising:
computing the natural response only once for quantization of each filtered input signal data sample.

12. The method as in claim 1 wherein the set of input data signal samples used to determine the natural response of the loop filter equals N.

13. The method as in claim 1 wherein the set of output candidate vectors is reduced to less than $2^N$ without decreasing quantization accuracy.

14. The method as in claim 1 wherein the input signal data sample comprises audio input signal data.

15. The method as in claim 1 further comprising:
recording quantized input signal data on storage media.

16. The method as in claim 1 further comprising:
for each time t, determining a dot product of each pruned pattern response with the natural response using substantially only addition operations.

17. A signal processing system comprising:
a look-ahead delta sigma modulator comprising:
a loop filter;
a pattern response generator coupled to the loop filter to determine a set of pattern responses by the loop filter obtained by setting signal input data to the loop filter to at least approximately zero and filtering a set of output candidate vectors;
a natural response generator to determine a natural response of the loop filter by setting feedback data to the loop filter to at least approximately zero and filtering a set of input data signal samples;
a pruning generator to determine a set of one or more pruned pattern responses; and
a quantizer to receive output data from the loop filter and the set of pruned pattern responses, wherein the quantizer includes a function generator to quantize each input signal data sample by applying predetermined decision criteria to determine a best match between a member of the set of one or more pruned pattern responses and selecting output data from the output candidate vector associated with the pruned pattern response used to determine the best match.

18. The signal processing system as in claim 17 wherein the natural response and each pattern response are respective vectors and the pruning generator is configured to select each pattern response vector that includes a vector element that proximally matches a corresponding reference element of the natural response vector.

19. The signal processing system as in claim 18 wherein the pruning generator is further configured to determine if the vector element of the pattern response vector that corresponds to the reference element of the natural response vector is within a prescribed linear distance.

20. The signal processing system as in claim 18 wherein the pruning generator is further configured to determine a prescribed number of pattern response vectors that include respective elements having shortest linear distances to a corresponding natural response vector reference element value.

21. The signal processing system as in claim 17 further comprising:
a memory coupled to the loop filter to store the determined set of pattern responses of the loop filter for each output candidate vector.

22. The signal processing system as in claim 17 wherein:
applying the predetermined decision criteria to determine the best match comprises determining a lowest power match between a member of the set of one or more pruned pattern responses and the natural response; and
selecting output data from the output candidate vector associated with the pruned pattern response used to determine the best match comprises selecting the output candidate vector associated with the lowest power match.

23. The signal processing system as in claim 22 wherein determining a lowest power match between one of the pruned pattern responses and the natural response comprises determining a dot product for each pruned pattern response and the natural response.

24. The signal processing system as in claim 17 wherein:
applying the predetermined decision criteria to determine the best match comprises determining a lowest power match between a member of the set of one or more pruned pattern responses and the natural response wherein at least one element of the pruned pattern response is weighted with a weight different than any other element of the pruned pattern response; and
selecting output data from the output candidate vector associated with the pruned pattern response used to determine the best match comprises selecting the output candidate vector associated with the lowest power match.

25. The signal processing system as in claim 17 wherein the set of pattern responses does not include pattern responses that provide duplicate best match determinations.

26. The signal processing system as in claim 17 wherein to determine the set of pattern responses of the loop filter of the look-ahead delta sigma modulator the natural response generator includes components to precompute the set of pattern responses before quantizing each input signal data sample.

27. The signal processing system as in claim 17 wherein the natural response generator generates the natural response only once for quantization of each filtered input signal data sample.

28. The signal processing system as in claim 17 wherein the set of input data signal samples used to determine the natural response of the loop filter equals N, wherein N is a look-ahead depth and is greater than or equal to two (2).

29. The signal processing system as in claim 17 wherein the set of output candidate vectors is reduced to less than $2^N$ without decreasing quantization accuracy, wherein N is a look-ahead depth and is greater than or equal to two (2).

30. The signal processing system as in claim 17 wherein the input signal data sample comprises audio input signal data.

31. The signal processing system as in claim 17 further comprising:
signal processing and recording equipment to process output data from the quantizer and record the processed output data on storage media.

32. The signal processing system as in claim 17 wherein the quantizer further comprises:
an add/compare/select system to combine each pruned pattern response with the natural response using substantially only addition operations, compare the combinations, and select the output data.

33. An apparatus for processing input signal data using a look-ahead delta sigma modulator of depth N using natural and pattern loop filter responses, wherein N is greater than or equal to two (2), the apparatus comprising:
means for determining a set of pattern responses of a loop filter of the look-ahead delta sigma modulator for each output candidate vector by setting signal input data to the loop filter of the delta sigma modulator to at least approximately zero and filtering a set of output candidate vectors;
means for determining a natural response of the loop filter of the look-ahead delta sigma modulator by setting feedback data to the loop filter to at least approximately zero and filtering a set of input data signal samples;
means for pruning the set of pattern responses to determine a set of one or more pruned pattern responses; and
means for quantizing each input signal data sample by applying predetermined decision criteria to determine a best match between a member of the set of one or more pruned pattern responses and the natural response and selecting quantization output data from the output candidate vector associated with the pruned pattern response used to determine the best match.

34. The apparatus as in claim 33 further comprising:
means to filter each output candidate vector and the input data signals.

35. A method of processing an input signal using a look-ahead delta sigma modulator of depth N, wherein N is greater than or equal to two, the method comprising:
pruning a set of candidate vectors by selecting a subset of the candidate vectors, wherein the subset of candidate vectors minimize quantization error of the look-ahead delta sigma modulator at a future time t+n, t is the current time, and $n \geq 2$; and
quantizing the input signal using the subset of candidate vectors.

36. The method of claim 35 further comprising:
determining a response of a loop filter of the look-ahead delta-sigma modulator from a natural response of the loop filter to a set of N input data signal samples and a forced response of the loop filter to the set of output candidate vectors;
wherein pruning a set of candidate vectors by selecting a subset of the candidate vectors, wherein the subset of candidate vectors minimize quantization error of the look-ahead delta sigma modulator at a future time t+n comprises pruning the set of pattern responses to determine a set of one or more pruned pattern responses; and
wherein quantizing the input signal using the subset of candidate vectors comprises quantizing each input signal data sample by applying predetermined decision criteria to determine a best match between a member of the set of one or more pruned pattern responses and the natural response and selecting output data from the output candidate vector associated with the forced response used to determine the best match.

37. The method as in claim 35 wherein the input signal data sample comprises audio input signal data.

38. The method as in claim 35 further comprising:
recording quantized input signal on storage media.

* * * * *